United States Patent
Zhu et al.

(10) Patent No.: US 9,893,682 B2
(45) Date of Patent: *Feb. 13, 2018

(54) AMPLIFIER LINEARIZATION IN A RADIO FREQUENCY SYSTEM

(71) Applicant: Skyworks Solutions, Inc., Woburn, MA (US)

(72) Inventors: Yu Zhu, Wellesley, MA (US); Boshi Jin, Winchester, MA (US); Steven Christopher Sprinkle, Hampstead, NH (US); Florinel G. Balteanu, Irvine, CA (US); Oleksiy Klimashov, Burlington, MA (US); Dylan Charles Bartle, Arlington, MA (US); Paul T. DiCarlo, Marlborough, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/191,960

(22) Filed: Jun. 24, 2016

(65) Prior Publication Data
US 2017/0005625 A1    Jan. 5, 2017

Related U.S. Application Data

(60) Provisional application No. 62/187,018, filed on Jun. 30, 2015, provisional application No. 62/235,054, filed on Sep. 30, 2015.

(51) Int. Cl.
*H04B 1/04* (2006.01)
*H03F 3/45* (2006.01)
(Continued)

(52) U.S. Cl.
CPC ......... *H03F 1/3205* (2013.01); *H03F 1/0266* (2013.01); *H03F 1/32* (2013.01);
(Continued)

(58) Field of Classification Search
CPC .......... H04B 1/04; H04B 1/0475; H04B 1/40; H04B 15/005; H04B 17/13;
(Continued)

(56) References Cited

U.S. PATENT DOCUMENTS 5,455,538 A    10/1995    Kobayashi
6,141,541 A *  10/2000    Midya .................. H03F 1/0227
                                                          455/108

(Continued)

OTHER PUBLICATIONS

Akmal, et al., "The effect of baseband impedance termination on the linearity of GaN HEMTs," Proceedings of the 40th European Microwave Conference, pp. 1046-1049, Sep. 2010.

(Continued)

*Primary Examiner* — Quochien B Vuong
(74) *Attorney, Agent, or Firm* — Knobbe, Martens, Olson & Bear, LLP

(57) ABSTRACT

A linearization circuit that reduces intermodulation distortion in an amplifier output receives a first signal that includes a first frequency and a second frequency and generates a difference signal having a frequency approximately equal to the difference of the first frequency and the second frequency. The linearization circuit generates an envelope signal based at least in part on a power level of the first signal and adjusts a magnitude of the difference signal based on the envelope signal. When the amplifier receives the first signal at an input terminal and the adjusted signal at a second terminal, intermodulation between the adjusted signal and the first signal cancels at least a portion of the intermodulation products that result from the intermodulation of the first frequency and the second frequency.

20 Claims, 35 Drawing Sheets

(51) Int. Cl.

| | |
|---|---|
| H03F 1/32 | (2006.01) |
| H03F 3/24 | (2006.01) |
| H03F 3/193 | (2006.01) |
| H03F 3/19 | (2006.01) |
| H04B 1/48 | (2006.01) |
| H04B 1/40 | (2015.01) |
| H04B 1/3827 | (2015.01) |
| H04B 1/525 | (2015.01) |
| H03F 1/02 | (2006.01) |
| H03F 3/195 | (2006.01) |
| H03F 3/21 | (2006.01) |
| H04W 88/02 | (2009.01) |

(52) U.S. Cl.
CPC ............ *H03F 3/19* (2013.01); *H03F 3/193* (2013.01); *H03F 3/195* (2013.01); *H03F 3/211* (2013.01); *H03F 3/245* (2013.01); *H03F 3/4508* (2013.01); *H03F 3/45179* (2013.01); *H04B 1/3827* (2013.01); *H04B 1/40* (2013.01); *H04B 1/48* (2013.01); *H04B 1/525* (2013.01); *H03F 2200/102* (2013.01); *H03F 2200/105* (2013.01); *H03F 2200/15* (2013.01); *H03F 2200/294* (2013.01); *H03F 2200/451* (2013.01); *H03F 2201/3215* (2013.01); *H03F 2201/3236* (2013.01); *H04B 2001/485* (2013.01); *H04W 88/02* (2013.01)

(58) Field of Classification Search
CPC .... H04B 2001/0408; H04B 2001/0425; H03F 1/025; H03F 1/0205; H03F 1/32; H03F 1/223; H03F 3/19; H03F 3/193; H03F 3/45179; H03F 2200/18; H03F 2200/2102; H03F 2200/451; H03F 2200/555
USPC ........... 455/63.1, 67.13, 114.1, 114.2, 115.1, 455/115.3, 127.1, 232.1, 234.1, 239.1, 455/295, 296; 330/149, 250, 251, 252, 330/253, 295, 296, 299, 300
See application file for complete search history.

(56) References Cited

U.S. PATENT DOCUMENTS

| | | | | |
|---|---|---|---|---|
| 6,320,464 B1* | 11/2001 | Suzuki | ........... | H03F 1/0211 330/151 |
| 6,496,065 B1 | 12/2002 | Kim | | |
| 6,717,980 B1* | 4/2004 | Rishi | ........... | H04B 1/525 455/73 |
| 6,725,021 B1* | 4/2004 | Anderson | ........... | H03F 1/0222 330/297 |
| 7,053,709 B1* | 5/2006 | Darvish-Zadeh | ..... | H03F 1/3241 330/136 |
| 7,276,966 B1* | 10/2007 | Tham | ........... | H03F 1/0222 330/136 |
| 7,656,229 B2* | 2/2010 | Deng | ........... | H03F 1/223 330/149 |
| 8,106,712 B2* | 1/2012 | Lee | ........... | H03F 1/0261 330/285 |
| 8,803,605 B2* | 8/2014 | Fowers | ........... | H03F 1/0238 330/127 |
| 9,002,303 B2* | 4/2015 | Brobston | ........... | H03F 1/0266 455/127.1 |
| 9,438,186 B2* | 9/2016 | Srinidhi Embar | ........ | H03F 3/21 |
| 9,496,838 B2* | 11/2016 | Winiecki | ........... | H03F 1/0222 |
| 2009/0072901 A1 | 3/2009 | Yamanouchi | | |
| 2017/0005623 A1 | 1/2017 | Zhu | | |
| 2017/0005624 A1 | 1/2017 | Zhu | | |
| 2017/0005625 A1 | 1/2017 | Zhu | | |
| 2017/0005626 A1 | 1/2017 | Zhu | | |

OTHER PUBLICATIONS

Asbeck, et al., "ET comes of age," IEEE Microw. Mag., vol. 17, No. 3, pp. 16-25, Mar. 2016.
Auer, et al., "Linearity and efficiency improvement using envelope tracking power amplifier," 2016 German Microwave Conference, pp. 88-91, 2016.
C. Fager, et al., "A Comprehensive Analysis of IMD Behavior in RF CMOS Power Amplifiers, "IEEE Journal of Solid-State Circuits, vol. 39, No. 1, pp. 24-34, Jan. 1, 2004.
Hu, et al., "A new method of third-order intermodulation reduction in nonlinear microwave systems," IEEE Trans. Microw. Theory Techn., vol. 34, No. 2, pp. 245-250, 1986.
Imai, et al., "Novel Linearizer Using Balanced Circulators and Its Application to Multilevel Digital Radio Systems," IEEE Transactions on Microwave Theory and Techniques, vol. 37, No. 8, pp. 1237-1243, Aug. 1989.
Kang, et al., "Analysis and Design of Feedforward Power Amplifier," IEEE MTT-S Digest, pp. 1519-1522, 1997.
Kim, et al., "High efficiency and wideband envelope tracking power amplifier with sweet spot tracking," IEEE Radio Frequency integrated circuits symposium, pp. 255-258, 2010.
Kim, et al., "Optimization for envelope shaped operation of envelope tracking power amplifier," IEEE Trans. Microw. Theory Techn., vol. 59, No. 7, pp. 1787-1795, 2011.
Leung, et al., "A new approach to amplifier linearization by the generalized baseband signal injection method," IEEE Microw. Compon. Lett., vol. 12, No. 9, pp. 336-338, 2002.
Liu, et al., "BSIM3v3.2.2 MOSFET Model," Department of Electrical Engineering and Computer Sciences, University of California, Berkeley, CA 94720, 228 pages, 1999.
Lou, et al., "A linearization technique for RF receiver front-end using second-order-intermodulation injection," IEEE J. Solid-State Circuits, vol. 43, No. 11, pp. 2404-2412, 2008.
Maas, "A GaAs MESFET Mixer with Very Low Intermodulation," IEEE Transactions on Microwave Theory and Techniques, vol. MTT-35, No. 4, pp. 425-429, Apr. 1987.
McCune, "Operating modes of dynamic power supply transmitter amplifiers," IEEE Trans. Microw. Theory Techn., vol. 62, No. 11, pp. 2511-2517, 2014.
Moazzam, et al., "A Low Third Order Intermodulation Amplifier with Harmonic Feedback Circuitry," IEEE MTT-S Digest, pp. 827-830, 1996.
Mokhti, et al., "Investigating the linearity versus efficiency tradeoff of different power amplifier modes in an envelope tracking architecture," Proceedings of the 10th European Microwave Integrated Circuits Conference, pp. 357-360, 2015.
Moon, et al., "Optimization of Idle current in envelope tracking power amplifier for efficiency and linearity," Proceedings of the 11th European Microwave Integrated Circuits, pp. 141-144, Oct. 2016.
Wang, et al., "Envelope tracking power amplifiers for wire communications," Boston: Artech House, 2014, pp. 75-81.
Wu, et al., "Performance analysis of envelope tracking power amplifier's envelope shaping methods for LTE mobile terminal application," 2014 IEEE 25th International Symposium on Personal, Indoor and Mobile Radio Communications, pp. 768-773.
Yang, et al., "A new linear amplifier using low-frequency second-order intermodulation component feedforwarding," IEEE Microw. Guided Wave Lett., vol. 9, No. 10, pp. 419-421, 1999.
Yusoff, et al., "Linearity improvement in RF power amplifier system using integrated auxiliary envelope tracking system," IEEE MTT-S Int. Microwave Symp. Dig., 2011, pp. 1-4.
Zhu, et al., "Analysis, simulation, and measurement of envelope tracking linearization," 2016 Asia-Pacific Microwave Conference, TU1B-5.

\* cited by examiner

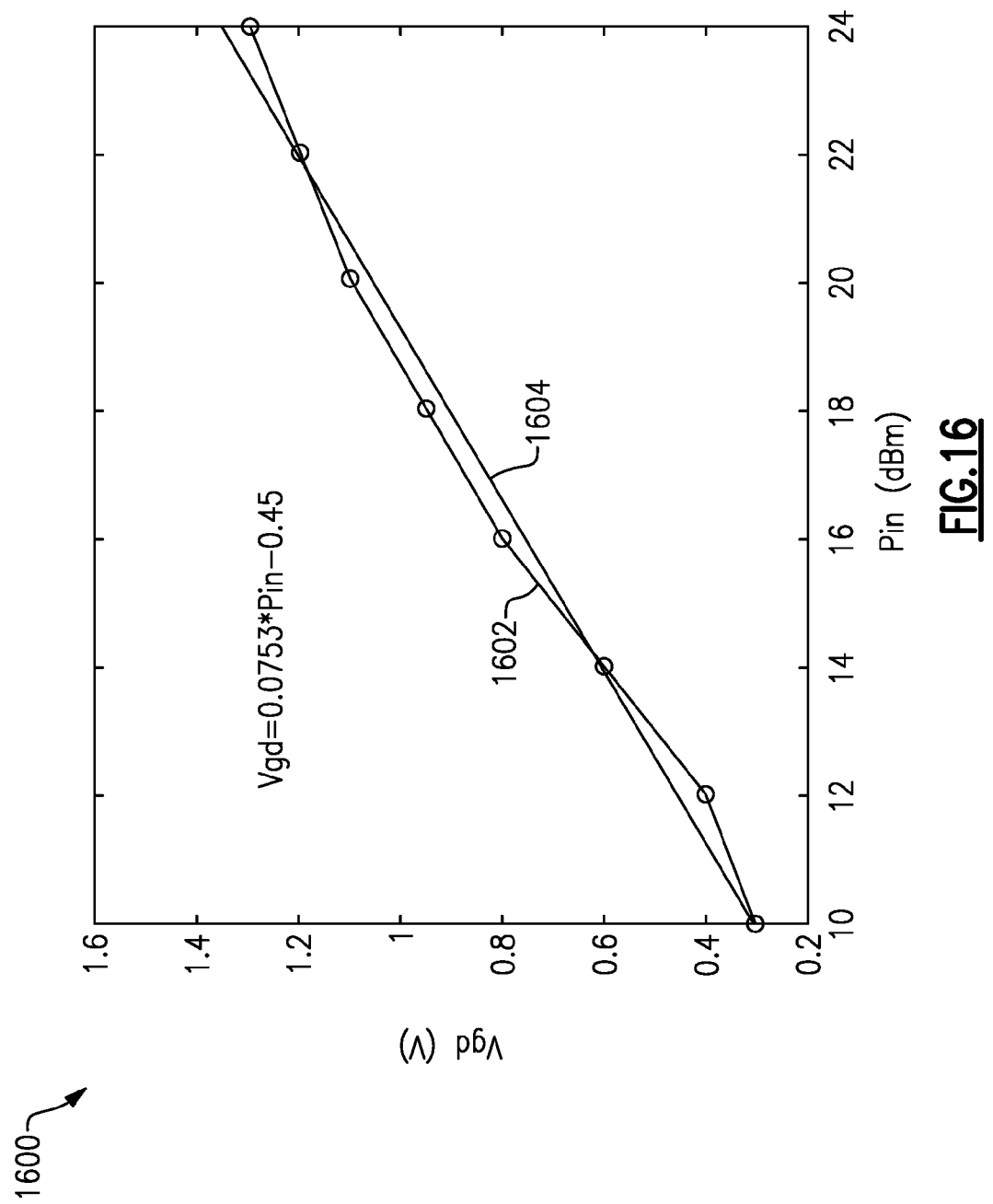

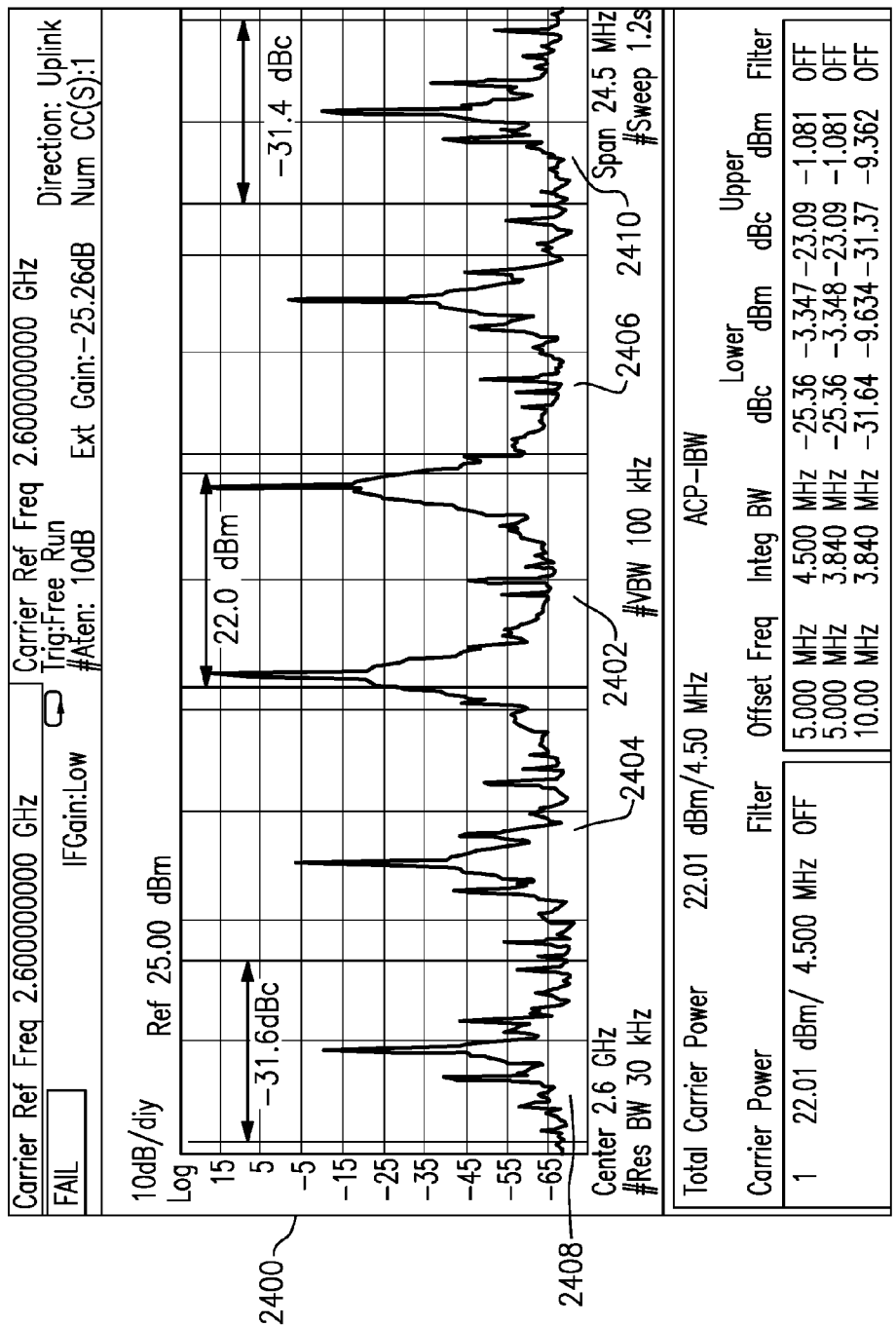

W/ ET (Linear shaping table)

US 9,893,682 B2

AMPLIFIER LINEARIZATION IN A RADIO FREQUENCY SYSTEM

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application claims the benefit of priority under 35 U.S.C. § 119(e) of U.S. Provisional Application No. 62/187,018 filed on Jun. 30, 2015 and titled "AMPLIFIER LINEARIZATION SYSTEMS AND METHODS" and U.S. Provisional Application No. 62/235,054 filed on Sep. 30, 2015 and titled "MULTISTAGE AMPLIFIER LINEARIZATION SYSTEMS AND METHODS", the entireties of which are incorporated herein by reference.

BACKGROUND

Field

Embodiments of the invention relate to electronic systems, and in particular, to radio frequency (RF) electronics.

Description of the Related Technology

Intermodulation distortion (IMD) is the amplitude modulation of signals containing two or more different frequencies in a system with nonlinearities. The intermodulation between each frequency component will form additional signals at frequencies that are not just at harmonic frequencies of either, but also at the sum and difference frequencies of the original frequencies and at multiples of those sum and difference frequencies. An ideal amplifier would be a linear device, but real amplifiers are nonlinear, and when amplifying input signals containing two or more different frequencies, amplifier output signals exhibit IMD. Amplifiers can comprise bipolar junction transistors (BJT) having a base, a collector, and an emitter, field effect transistors (FET) having a gate, a drain, and a source.

SUMMARY

According to a number of embodiments, the disclosure relates to a method to improve amplifier linearity. The method comprises receiving at a first terminal of an amplifier a first signal including signal components having a first frequency and signal components having a second frequency; generating a second signal having a third frequency approximately equal to the difference of the first frequency and the second frequency; adjusting an amplitude of the second signal based at least in part on a power level of the first signal; and applying the second signal to a second terminal of the amplifier to generate intermodulation between the first and the second signals to cancel at least a portion of intermodulation components in a third signal being output from the amplifier.

In an embodiment, the intermodulation components include third order intermodulation products of the first and second frequencies. In another embodiment, the amplifier includes one or more field effect transistors (FETs). In a further embodiment, the first terminal includes a gate terminal. In a yet further embodiment, the second terminal includes a drain terminal. In an embodiment, the amplifier includes one or more bipolar junction transistors (BJTs). In another embodiment, the first terminal includes a base terminal. In a further embodiment, the second terminal includes a collector terminal.

Certain embodiments relate to amplifier linearization circuit assembly for reducing intermodulation distortion in an amplifier. The amplifier linearization circuit assembly comprises a difference frequency circuit configured to receive a first signal including a first frequency and a second frequency and to generate a second signal having a frequency approximately equal to the difference of the first frequency and the second frequency. When received at an input terminal of an amplifier, the first signal generates first intermodulation products between the first and second frequencies in the output signal of the amplifier. The amplifier linearization circuit assembly further comprises an envelope generator configured to detect a power level of the first signal; and an envelope adjustor configured adjust a magnitude of the second signal based at least in part on the power level of the first signal, where the adjusted signal is configured to be applied to a second terminal of the amplifier to generate second intermodulation products with the first signal that cancel at least a portion of first intermodulation products. The cancellation improves amplifier linearity.

In an embodiment, the amplifier includes a power amplifier. In another embodiment, the second terminal of the amplifier is a drain terminal of the amplifier. In a further embodiment, the first intermodulation products include third order intermodulation products between the first frequency and the second frequency and the second intermodulation products include second order intermodulation products between the first signal and the adjusted signal. In a yet further embodiment, a wireless communication device comprises the amplifier linearization circuit assembly.

According to other embodiments, the disclosure relates to a wireless mobile device comprising an antenna configured to receive and transmit radio frequency (RF) signals, a transceiver configured to provide the antenna with RF signals for transmission and to receive from the antenna RF signals for processing, the transceiver including an amplifier configured to amplify an RF input signal. The amplifier includes an input configured to receive the RF input signal and an output configured to provide an amplified RF signal. The wireless mobile device further includes an apparatus configured to reduce intermodulation distortion in the amplifier, where the apparatus includes a difference frequency circuit configured to receive the RF input signal that includes a first frequency and a second frequency and to generate a second signal having a frequency approximately equal to the difference of the first frequency and the second frequency, an envelope generator configured to detect a power level of the radio frequency input signal, and an envelope adjustor configured adjust an amplitude of the second signal based at least in part on the power level of the radio frequency input signal. The amplifier further includes a drain terminal configured to receive the envelope-adjusted signal to cancel at least a portion of intermodulation products from the amplified radio frequency signal.

In an embodiment, the amplifier includes a power amplifier. In another embodiment, the amplifier includes a low noise amplifier. In a further embodiment, the intermodulation products include third order intermodulation products of the first and second frequencies. In a yet further embodiment, the envelope-adjusted signal is further configured to generate second order intermodulation products with the radio frequency input signal that cancel at least a portion of the third order intermodulation products. In another embodiment, the intermodulation products include fifth order intermodulation products of the first and second frequencies.

BRIEF DESCRIPTION OF THE DRAWINGS

FIG. 16 is a graph illustrating the correlation between the optimal amplitude of the gate to drain voltage and input power, according to certain embodiments.

FIG. 24A is a plot of output signal power verses frequency for a radio frequency (RF) power amplifier without linearization, according to certain embodiments.

DETAILED DESCRIPTION OF CERTAIN EMBODIMENTS

In an embodiment, linearizers are electronic circuits, which improve the non-linear behavior of amplifiers to increase efficiency and maximum output power. These circuits counteract the non-linearities of the amplifier and minimize the distortion of the signal. This increases the linear operating range up to the saturation (maximum output power) of the amplifier. Linearized amplifiers have a significantly higher efficiency with improved signal quality. Techniques to avoid the undesired effects of intermodulation distortion include feedforward, feedback, predistortion, digital predistortion and postdistortion linearization. Embodiments disclosed herein provide significant improvement in amplifier linearization with simpler circuitry.

Intermodulation distortion (IMD) is the amplitude modulation of signals containing two or more different frequencies in a system with nonlinearities. The intermodulation between each frequency component will form additional signals at frequencies that are not just at harmonic frequencies (integer multiples) of either, like harmonic distortion, but also at the sum and difference frequencies of the original frequencies and at multiples of those sum and difference frequencies.

When a signal comprising two different frequencies is input (or injected) into the gate or base of the transistor, the intermodulation distortion (IMD) generated between the two frequencies is defined as gate to gate intermodulation distortion (G-G IMD).

When a signal comprising a single frequency is input (or injected) into the gate or base and a signal comprising a different single frequency is input (or injected) into the drain or collector of the transistor, the intermodulation distortion generated between the two frequencies is defined as gate to drain intermodulation distortion (G-D IMD).

In an embodiment, when the frequency of the drain-injected signal is equal or approximately equal to the difference frequency of the gate-injected two-frequency signal, the frequency of at least a portion of the G-G IMD is approximately the same as that of the G-D IMD. Further, the G-G IMD and the G-D IMD are intrinsically in opposite phase for both FETs and BJTs. The magnitude of the G-D IMD can be adjusted independently, or in other words, without changing the magnitude of the G-G IMD. In an embodiment, improved linearization can be achieved controlling the magnitude and frequency of the G-D IMD to cancel the G-G IMD. This IMD cancellation can be applied to multi-tone or n-tone signals, where n≥2.

Figure 1:
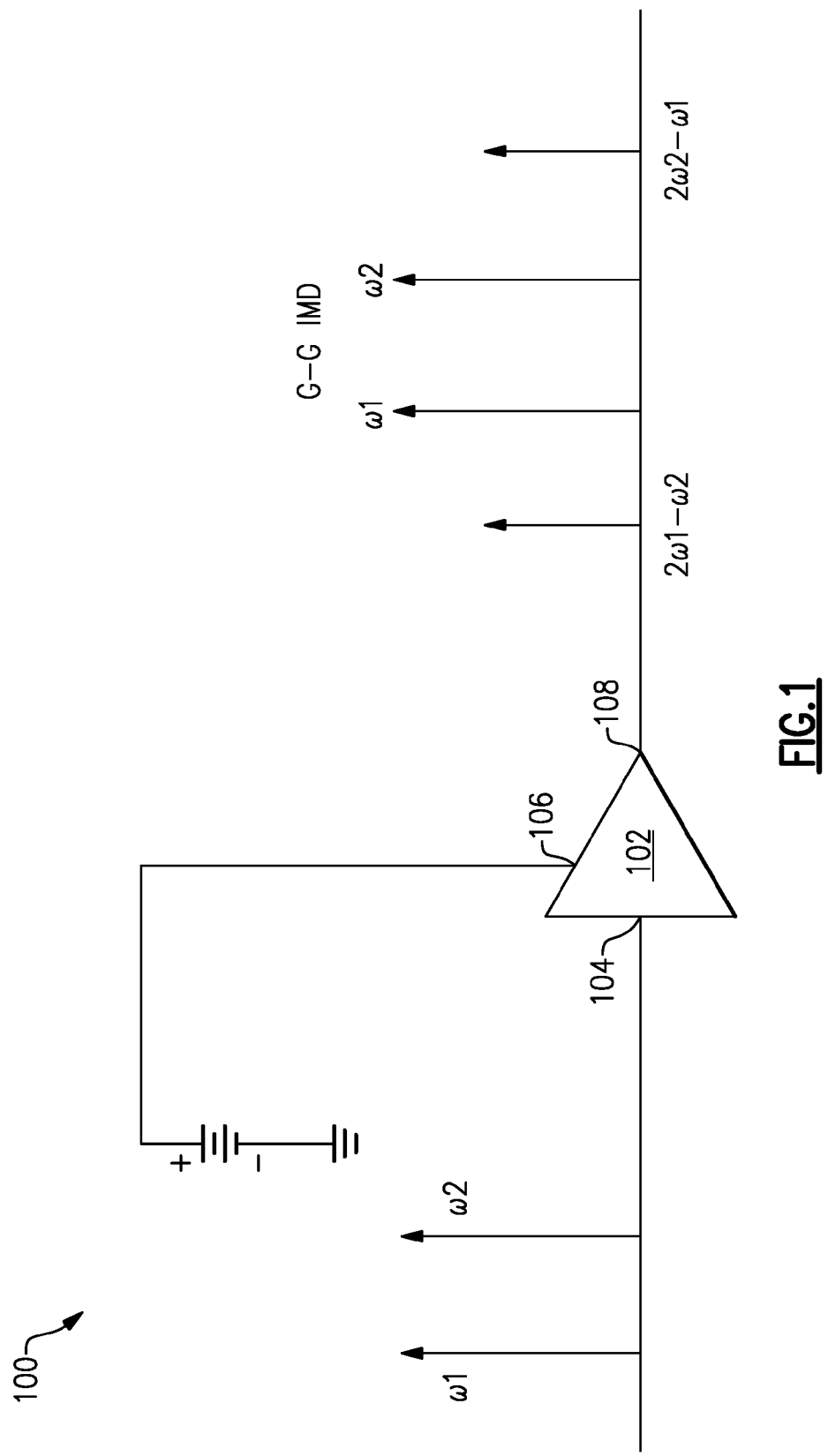
FIG. 1 is a schematic diagram illustrating gate to gate intermodulation distortion, according to certain embodiments.

FIG. 1 is a schematic diagram 100 illustrating gate to gate intermodulation distortion (G-G IMD) for an amplifier 102 having a first terminal 104, a second terminal 106 and a third terminal 108. An input signal is received at the first or input terminal 104 and an output signal is output at the third or output terminal 108. The amplifier 102 comprises one or more transistors. In an embodiment, the transistors comprise field effect transistors (FETs) and the first terminal comprises a gate of the FET, the second terminal comprises a DC access of a drain of the FET, and the third terminal comprises a radio frequency (RF) access of the drain of the FET. In another embodiment, the transistors comprise bipolar junction transistors (BJTs), and the first terminal comprises a base of the BJT, the second terminal comprises a DC access of a collector of the BJT, and the third terminal comprises an RF access of the collector of the BJT. For simplicity, throughout the disclosure, the gate or base will be referred to as the gate, the drain or collector will be referred to as the drain, and the source or emitter will be referred to as the source.

A 2-tone signal having a first fundamental frequency ω1 and a second fundamental frequency ω2 is input into the amplifier 102 at the gate terminal 104 and the drain terminal 106 is electrically coupled to a DC voltage, Vdc. The amplifier 102 amplifies the input signal and outputs at the output terminal 108 a signal comprising an amplified first fundamental frequency ω1 and an amplified second fundamental frequency ω2. Due to the non-linear nature, the amplifier 102 mixes ω1 and ω2. Mixing of ω1 and ω2 results in intermodulation products having frequencies of, for example (±ω1±ω2), (±ω1±2ω2), (±2ω1±ω2), (±2ω1±2ω2), ..., (±mω1±nω2). Many of the intermodulation products can be filtered from the output signal. However, as illustrated in FIG. 1, the third order intermodulation products, 2ω1−ω2 and 2ω2−ω1, are close to the fundamental frequencies, ω1 and ω2, and are difficult to remove from the output signal by filtering.

Figure 2:
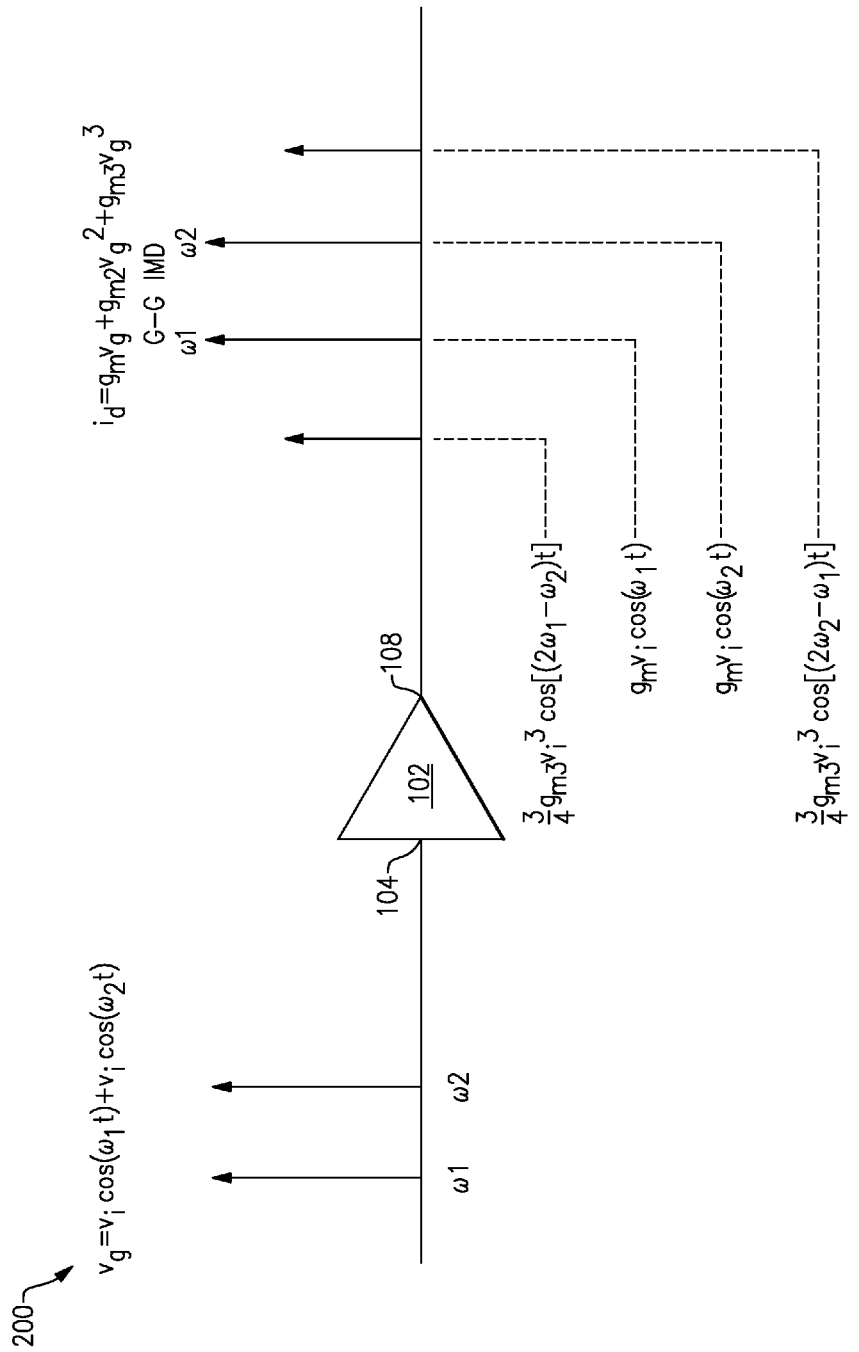
FIG. 2 is a schematic diagram illustrating the amplitude of gate to gate intermodulation distortion, according to certain embodiments

FIG. 2 is a schematic diagram 200 illustrating G-G IMD for the amplifier 102. A gate voltage signal, $v_g=v_i \cos(\omega_1 t)+v_i \cos(107\ _2 t)$, is received at the input to the amplifier 102 and a drain current signal, $i_d=g_m v_g+g_{m2} v_g^2+g_{m3} v_g^3$, is output from the amplifier 102. The fundamental frequency components of the output signal are:
$g_m v_i \cos(\omega_1 t)$; and
$g_m v_i \cos(\omega_2 t)$.
The third order intermodulation components of the output signal are:
$\frac{3}{4} g_{m3} v_i^3 \cos[(2\omega_1-\omega_2)t]$; and
$\frac{3}{4} g_{m3} v_i^3 \cos[(2\omega_2-\omega_1)t]$.
where $g_m$ is the transconductance of the amplifier, $g_{m3}$ is the second derivative of $g_m$, and $v_i$, is the amplitude of the input signal. Transconductance is the ratio of the change in drain current to the change in gate voltage over a defined, arbitrarily small interval on the drain-current-versus-gate-voltage curve.

When the functional relationship between the gate voltage and the drain current is known, the transconductance $g_m$ is the first derivative of $i_d$ versus $v_g$, and $g_{m3}$ is the third derivative of $i_d$ versus $v_g$, or the second derivative of $g_m$ versus $v_g$. When the functional relationship is not known, the drain current at various gate voltages can be measured and transconductance can be calculated.

Figure 3:
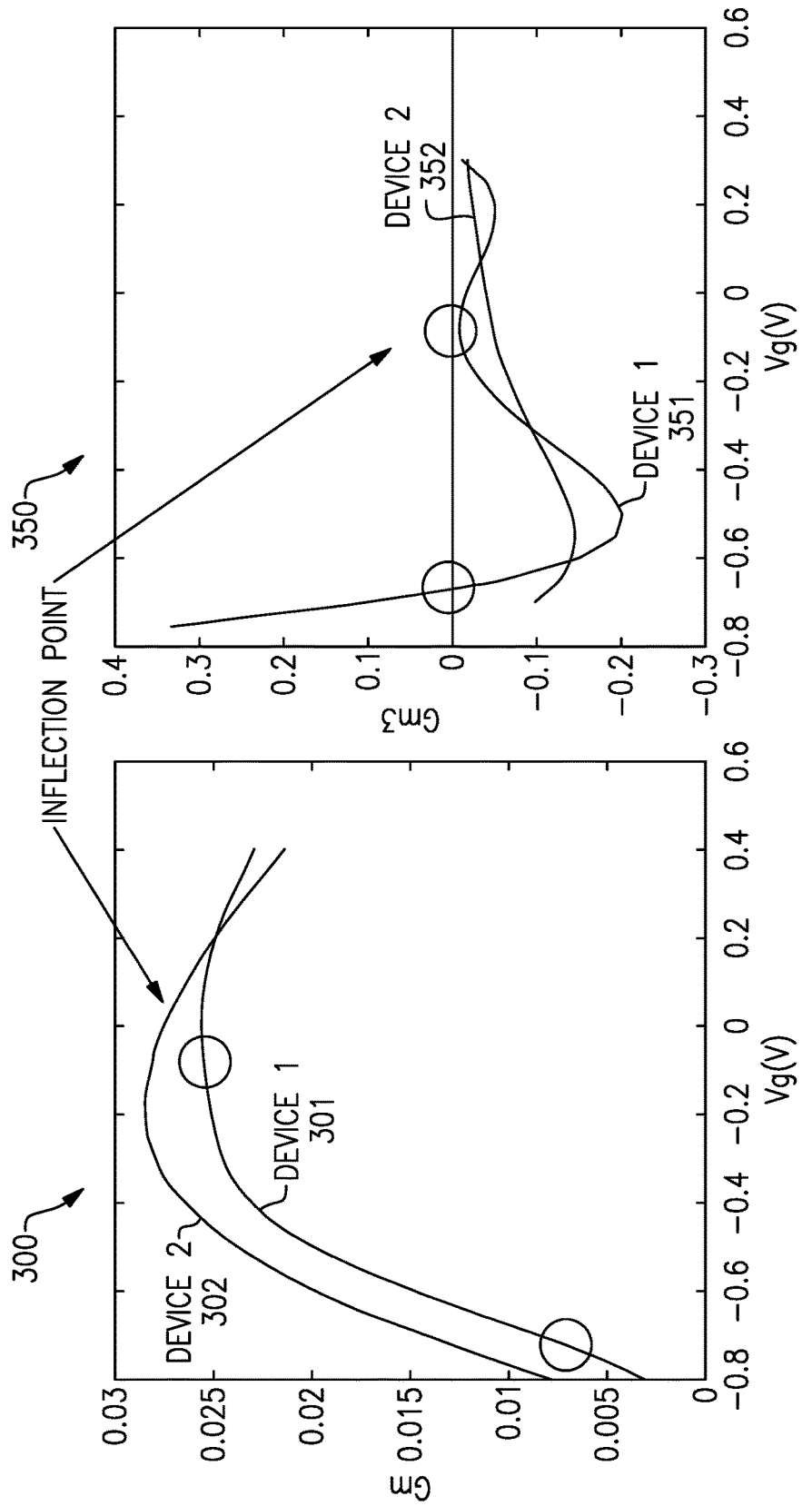
FIG. 3A is a graph of the transconductance versus the gate voltage for exemplary devices, according to certain embodiments.
FIG. 3B is a graph of the transconductance for the third order intermodulation products versus the gate voltage for the exemplary devices of FIG. 3A, according to certain embodiments.

FIG. 3A is a graph 300 of transconductance $g_m$ versus the gate voltage $v_g$ for exemplary devices, Device 1 and Device 2. The gate voltage $v_g$ in volts is shown on the x-axis and the transconductance $g_m$ in amperes per volt is shown on the y-axis. Curve 301 illustrates the transconductance at various gate voltages for Device 1 and curve 302 illustrates the transconductance at various gate voltages for Device 2.

FIG. 3B is a graph 350 of transconductance $g_{m3}$ of the third order intermodulation products versus the gate voltage $v_g$ for Device 1 and Device 2. The gate voltage $v_g$ in volts is shown on the x-axis and $g_{m3}$, in A/V³, is shown on the y-axis. Curve 351 illustrates $g_{m3}$ at various gate voltages for Device 1 and curve 352 illustrates $g_{m3}$ at various gate voltages for Device 2.

As illustrated by curves 301 and 302, the transconductance is typically a concave function of the gate voltage. The $g_{m3}$, which is the second derivative of the curves 301 and 302, is substantially negative. This is illustrated in FIG. 4.

Figure 4:
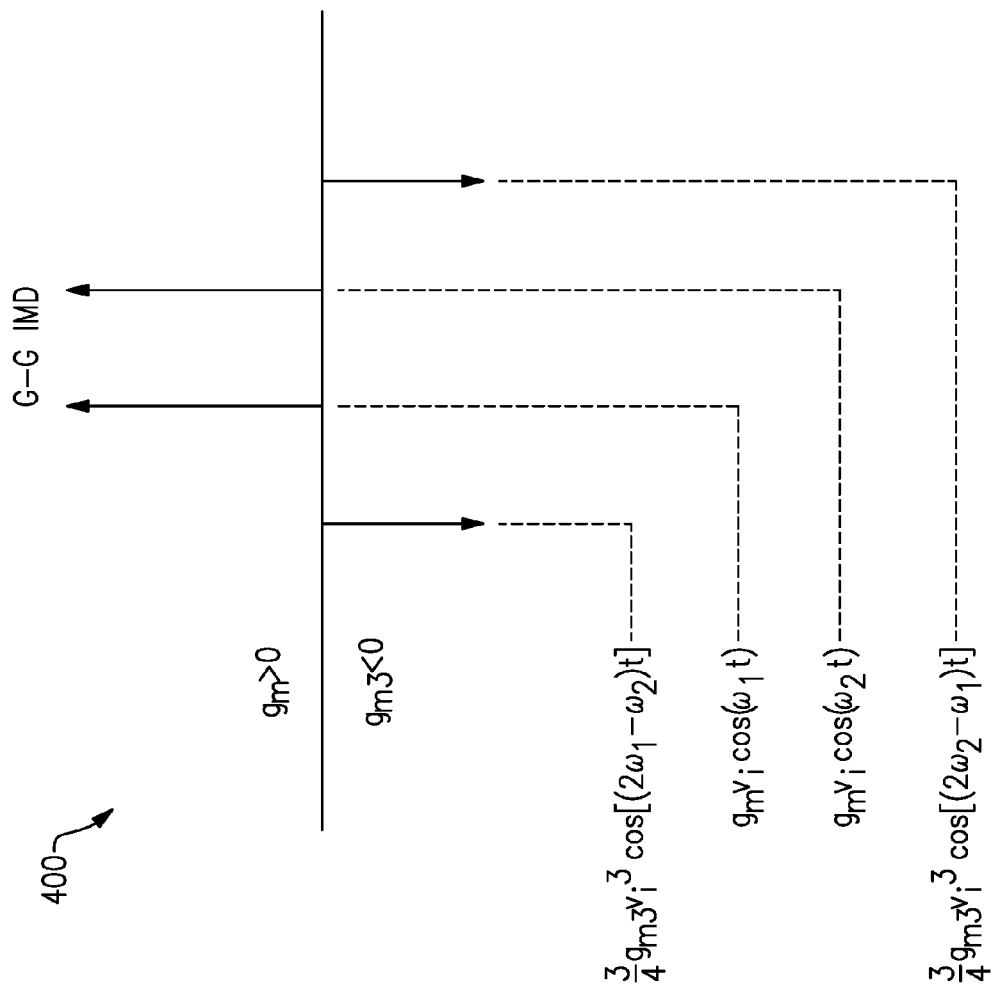
FIG. 4 is a schematic diagram illustrating the amplitude and phase of the gate to gate intermodulation distortion, according to certain embodiments.

FIG. 4 is a schematic diagram 400 illustrating the amplitude and phase of the G-G IMD. As shown, the phase of the fundamental frequency components of the output signal is positive and the phase of the third order intermodulation components of the output signal is negative.

Figure 5:
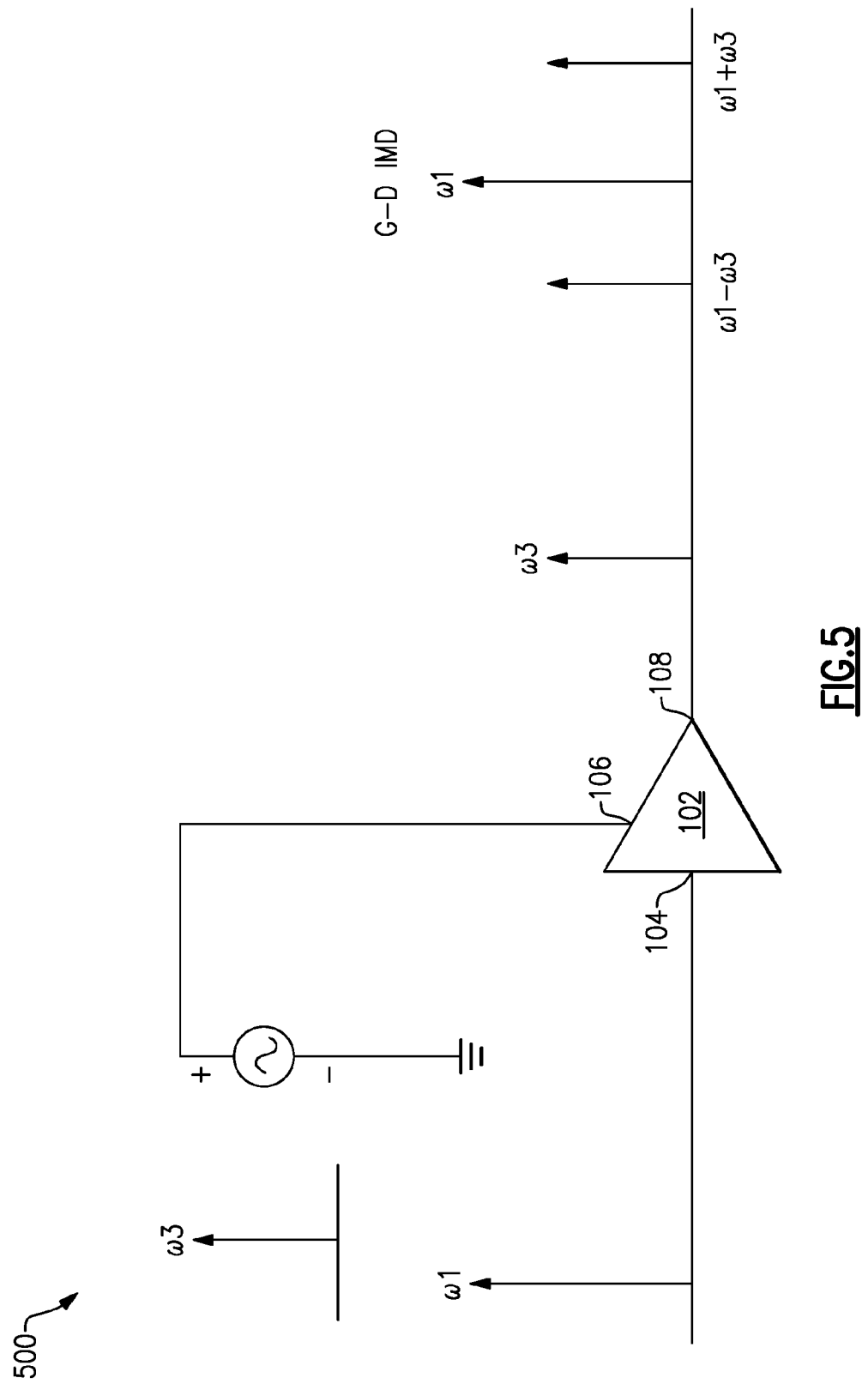
FIG. 5 is a schematic diagram illustrating gate to drain intermodulation, according to certain embodiments.

FIG. 5 is a schematic diagram 500 illustrating gate to drain intermodulation (G-D IMD) for the amplifier 102. In an embodiment, a first signal having the first fundamental frequency ω1 is received at the gate terminal 104 of the amplifier 102. A second signal having a third frequency ω3 is received at the drain terminal 106 of the amplifier 102. The amplifier 102 outputs at the output terminal 106 a signal comprising an amplified first fundamental frequency ω1 and an third frequency ω3.

Again, due to the non-linear system, the amplifier 102 mixes the first and third frequencies and outputs intermodulation products. The intermodulation products, ω1−ω3 and ω1+ω3, can be used to cancel at least a portion of the third order intermodulation products of the first and second fundamental frequencies, 2ω1−ω2 and 2ω2−ω1.

Figure 6:
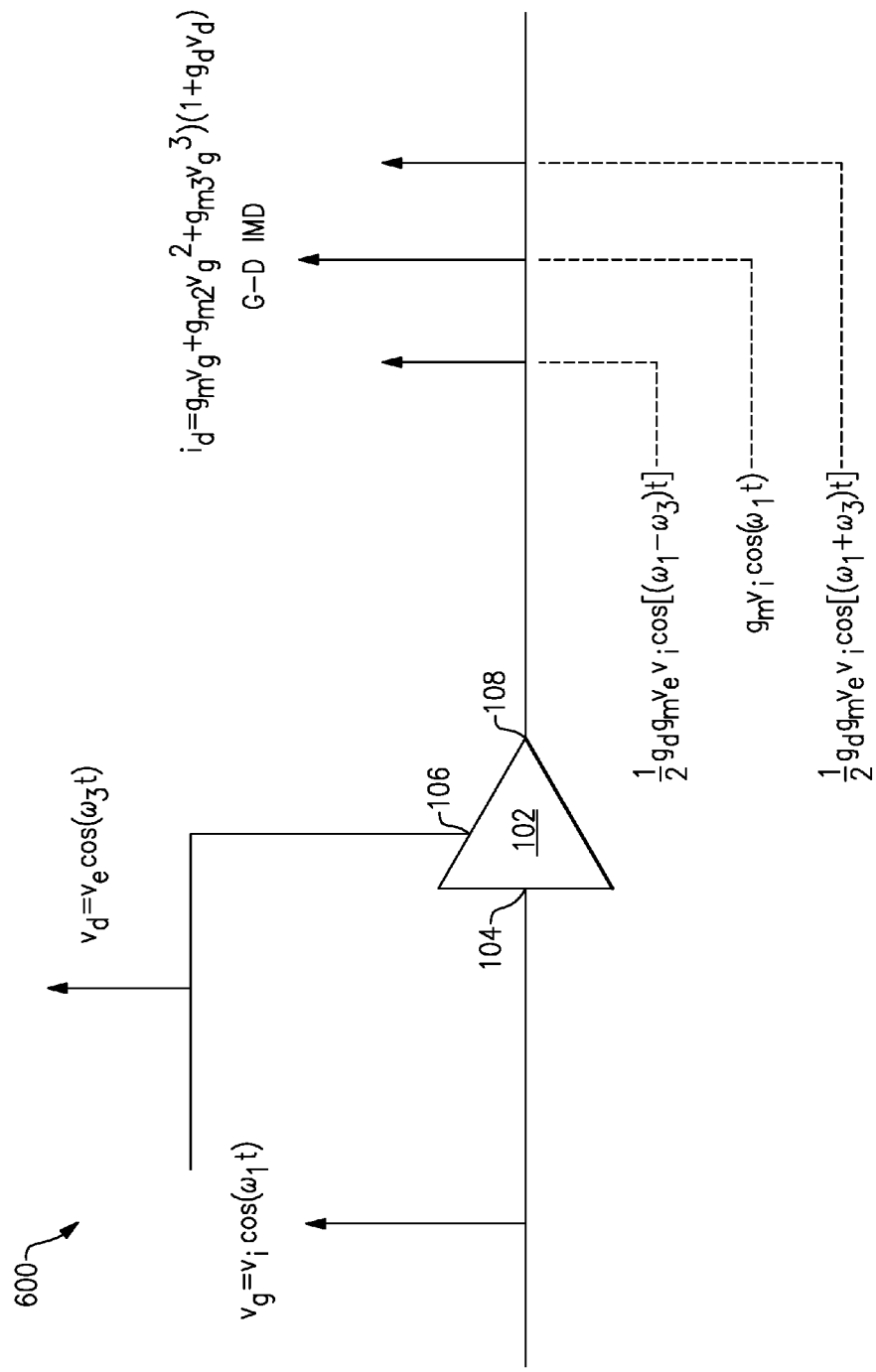
FIG. 6 is a schematic diagram illustrating the amplitude of the gate to drain intermodulation distortion, according to certain embodiments.

FIG. 6 is a schematic diagram 600 illustrating the amplitude of the G-D IMD for the amplifier 102. A gate voltage input signal, $v_g=v_i \cos(\omega_1 t)$, is received at the gate terminal 104 of the amplifier 102 and a drain voltage signal, $v_d=v_e \cos(\omega_3 t)$, is received at the drain terminal 106. A drain current signal, $i_d=(g_m v_g+g_{m2} v_g^2+g_{m3} v_g^3)(1+g_d v_d)$, is output from the amplifier 102. The fundamental frequency component of the output signal is:
$g_m v_i \cos(\omega_1 t)$.
The second order components of the output signal are:
$\frac{1}{2} g_d g_m v_e v_i \cos[(\omega_1-\omega_3)t]$; and
$\frac{1}{2} g_d g_m v_e v_i \cos[(\omega_1+\omega_3)t]$.
where $g_m$ is the transconductance of the fundamental frequency component in the output signal, $g_d$ is the output conductance, $v_i$ is the amplitude of the gate signal, and $v_e$ is the amplitude of the drain signal.

Figure 7:
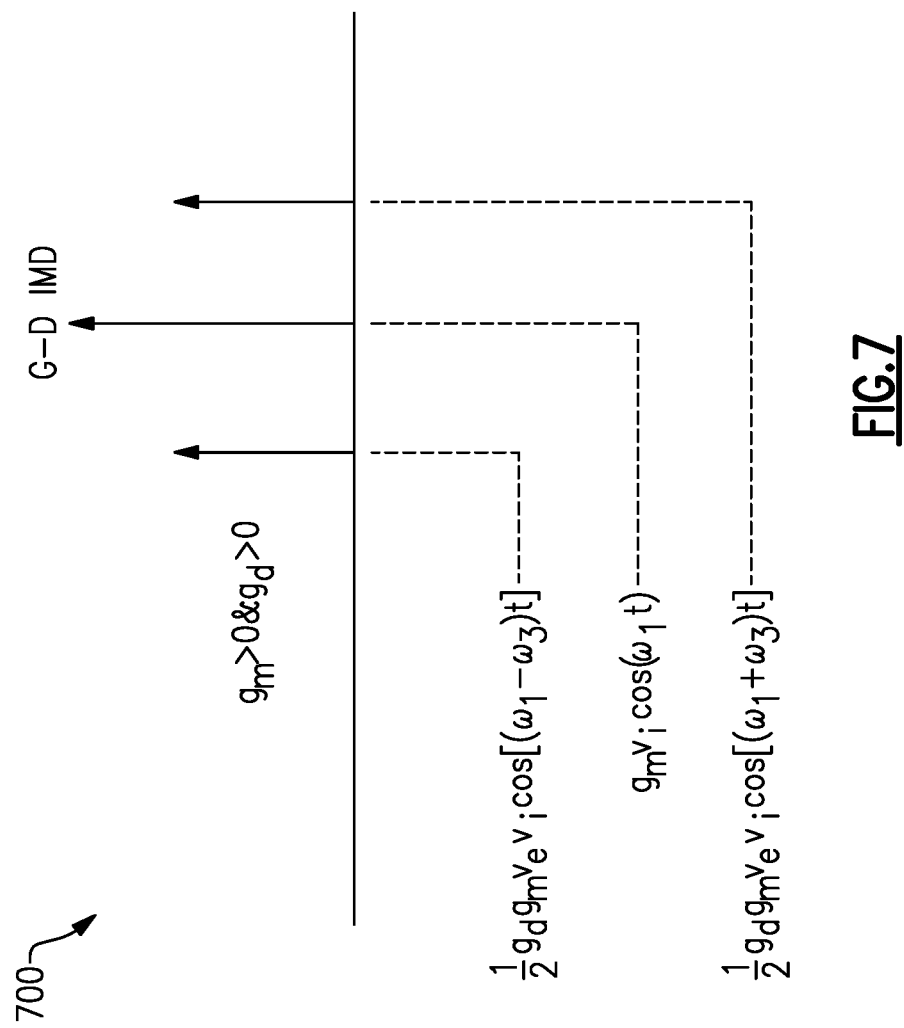
FIG. 7 is a schematic diagram illustrating the amplitude and phase of the gate to drain intermodulation distortion, according to certain embodiments.

FIG. 7 is a schematic diagram 700 illustrating the amplitude and phase of the G-D IMD. The transconductance $g_m$ of the fundamental frequency component in the output signal is positive, as well as the output conductance $g_d$.

Figure 8:
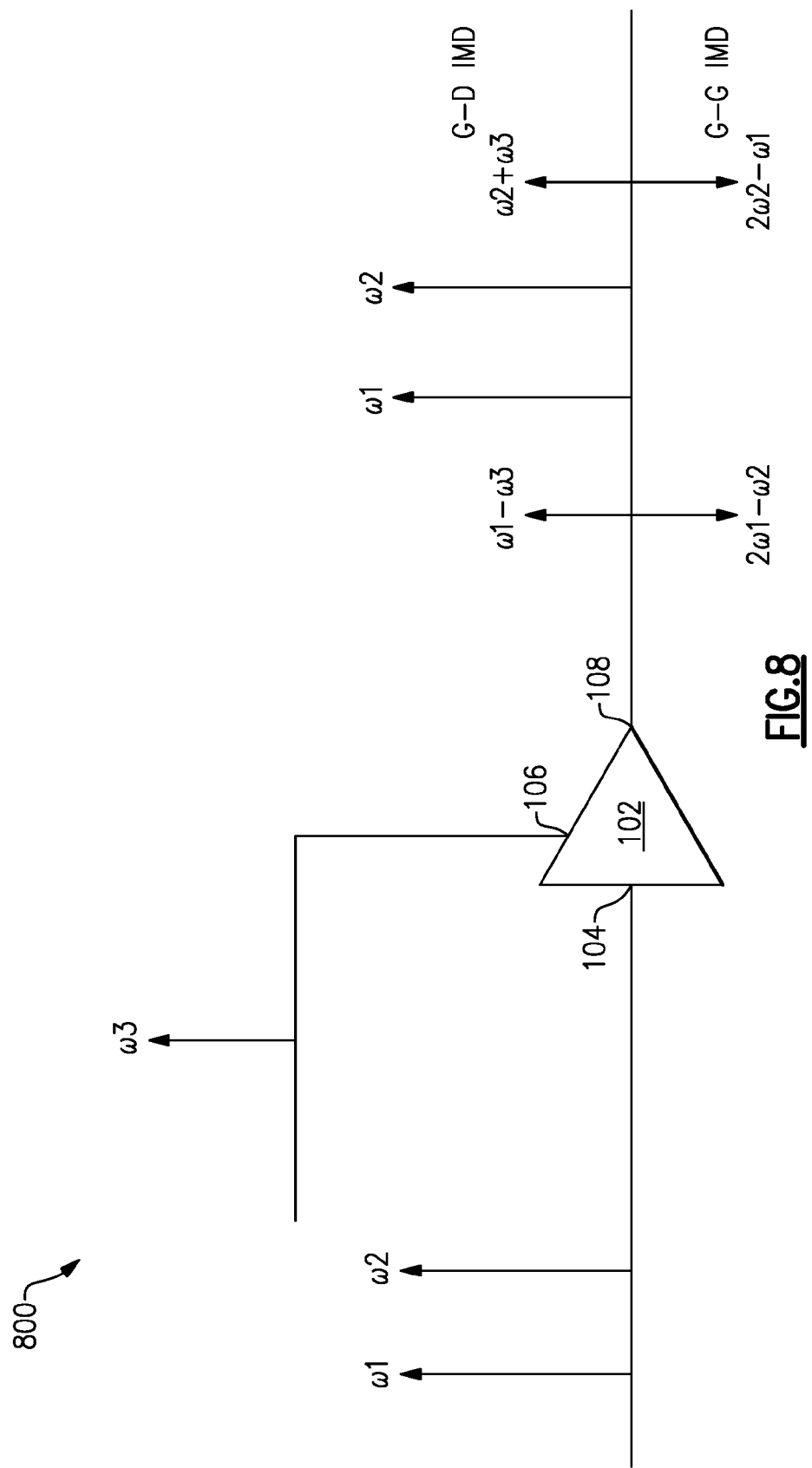
FIG. 8 is a schematic diagram illustrating an overlap between gate to gate intermodulation distortion and gate to drain intermodulation distortion, according to certain embodiments.

FIG. 8 is a schematic diagram 800 illustrating an overlap between the G-G IMD and the G-D IMD for the amplifier 102. The 2-tone signal having the first fundamental frequency ω1 and the second fundamental frequency ω2 is received at the gate terminal 104 of the amplifier 102 and the signal having the third frequency ω3 is received at the drain terminal 106 of the amplifier 102. The amplifier 102 outputs at the output terminal 108 a signal comprising an amplified first fundamental frequency ω1, an amplified second frequency ω2, G-G IMD products 2ω1−ω2 and 2ω2−ω1, and G-D IMD products ω1−ω3 and ω2+ω3. The spectrums of G-G IMD and G-D IMD overlap when ω3=ω2−ω1 or ω3≈ω2−ω1, and at least a portion of the G-G IMD can be canceled by the G-D IMD due to the overlap.

Figure 9:
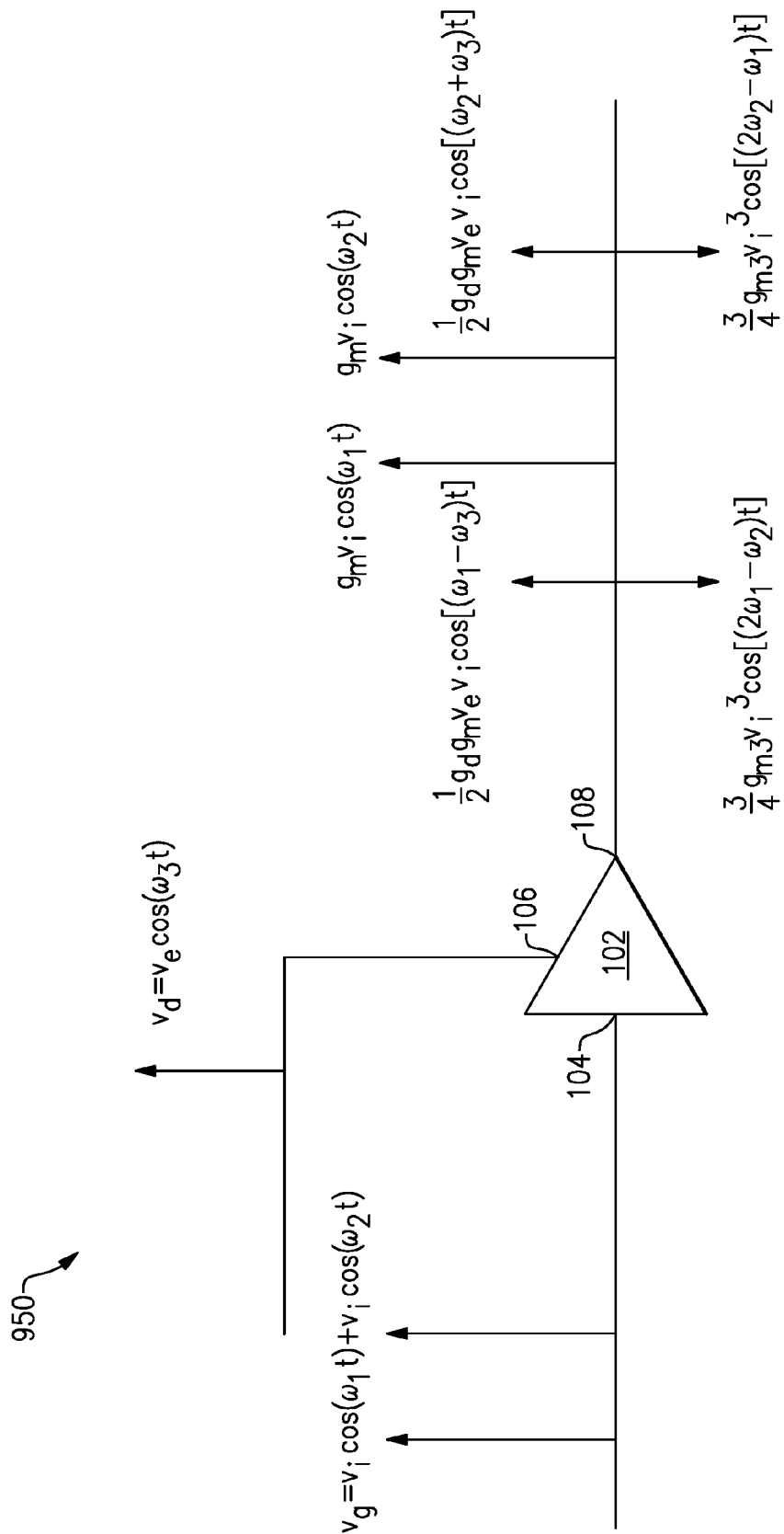
FIG. 9 is a schematic diagram illustrating the amplitude and phase of the gate to gate intermodulation distortion and gate to drain intermodulation distortion, according to certain embodiments.

FIG. 9 is a schematic diagram 950 illustrating the amplitude and phase of the G-G IMD and the G-D IMD distortion for the amplifier 102. A gate voltage input signal, $v_g=v_i \cos(\omega_1 t)+v_i \cos(\omega_2 t)$ is received at the gate terminal 104 to the amplifier 102 and a drain voltage signal, $v_d=v_e \cos(\omega_3 t)$ is received at the drain terminal 106. A drain current signal, $i_d=(g_m v_g+g_{m2} v_g^2+g_{m3} v_g^3)(1+g_d v_d)$ is output from the amplifier 102. The fundamental frequency components of the output signal are:

$g_m v_i \cos(\omega_1 t)$; and
$g_m v_i \cos(\omega_2 t)$.

The third order G-G IMD components of the output signal are:

$\frac{3}{4} g_{m3} v_i^3 \cos[(2\omega_1-\omega_2)t]$; and
$\frac{3}{4} g_{m3} v_i^3 \cos[(2\omega_2-\omega_1)t]$.

The second order G-D IMD components of the output signal are:

$\frac{1}{2} g_d g_m v_e v_i \cos[(\omega_1-\omega_3)t]$; and
$\frac{1}{2} g_d g_m v_e v_i \cos[(\omega_2+\omega_3)t]$.

The spectrums of the G-G IMD and the G-D IMD overlap when ω3=ω2−107 1 or ω3≈ω2−ω1, and at least some cancellation occurs when $g_d$>0, $g_m$>0, and $g_{m3}$<0.

G-G IMD and G-D IMD are opposite in phase with respect to the fundamental frequency. Cancellation occurs when $$\frac{2 g_d g_m v_e}{3 g_{m3} v_i^2} = -1.$$

The amplitude of G-D IMD can be adjusted by controlling the envelope voltage $V_e$ of the ω3 signal without substantially changing the amplitude of the G-G IMD.

Figure 10:
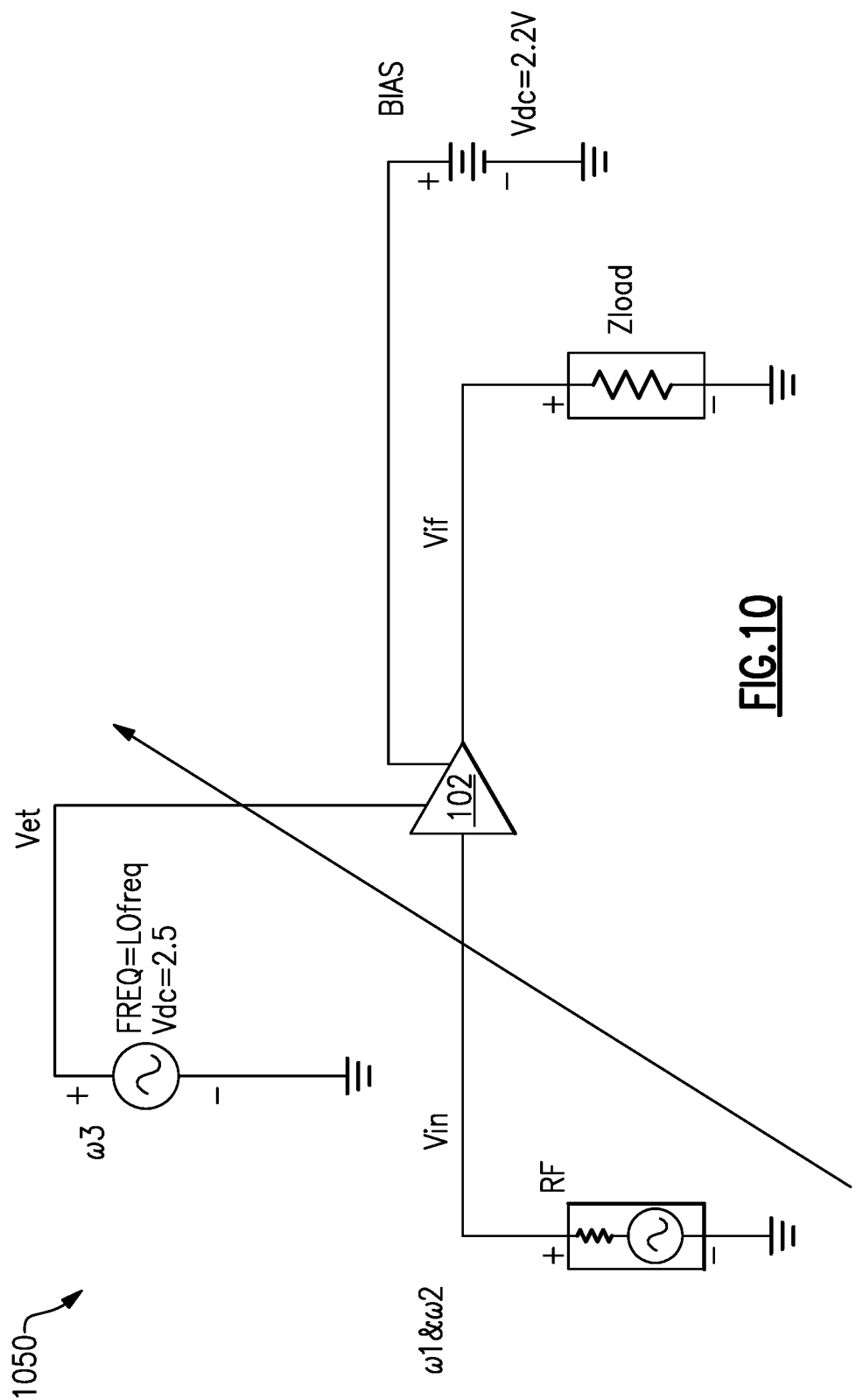
FIG. 10 is a schematic diagram illustrating a 3-tone harmonic balance simulation, according to certain embodiments.

FIG. 10 is a schematic diagram 1050 illustrating a 3-tone harmonic balance simulation where the amplitude of drain signal is swept during the simulation. In an embodiment, the simulation includes three orders of IMD. Fundamental frequencies ω1 and ω2 are received at the input gate 104 of the amplifier 102. Frequency ω3 is received at the drain terminal 106 of the amplifier 102 along with a DC offset voltage Voffset. The amplifier 102 is biased with a DC bias voltage Vbias and terminated with a termination load Zload. In an exemplary simulation, the simulation parameters comprise:

ω1=1.995 GHz;
ω2=2.0 GHz;
ω3=5 MHz;
Voffset=2.5V;
RF signal power=20 dBm;
Zload=50 Ohms; and
Vbias=2.2V.

Figure 11:
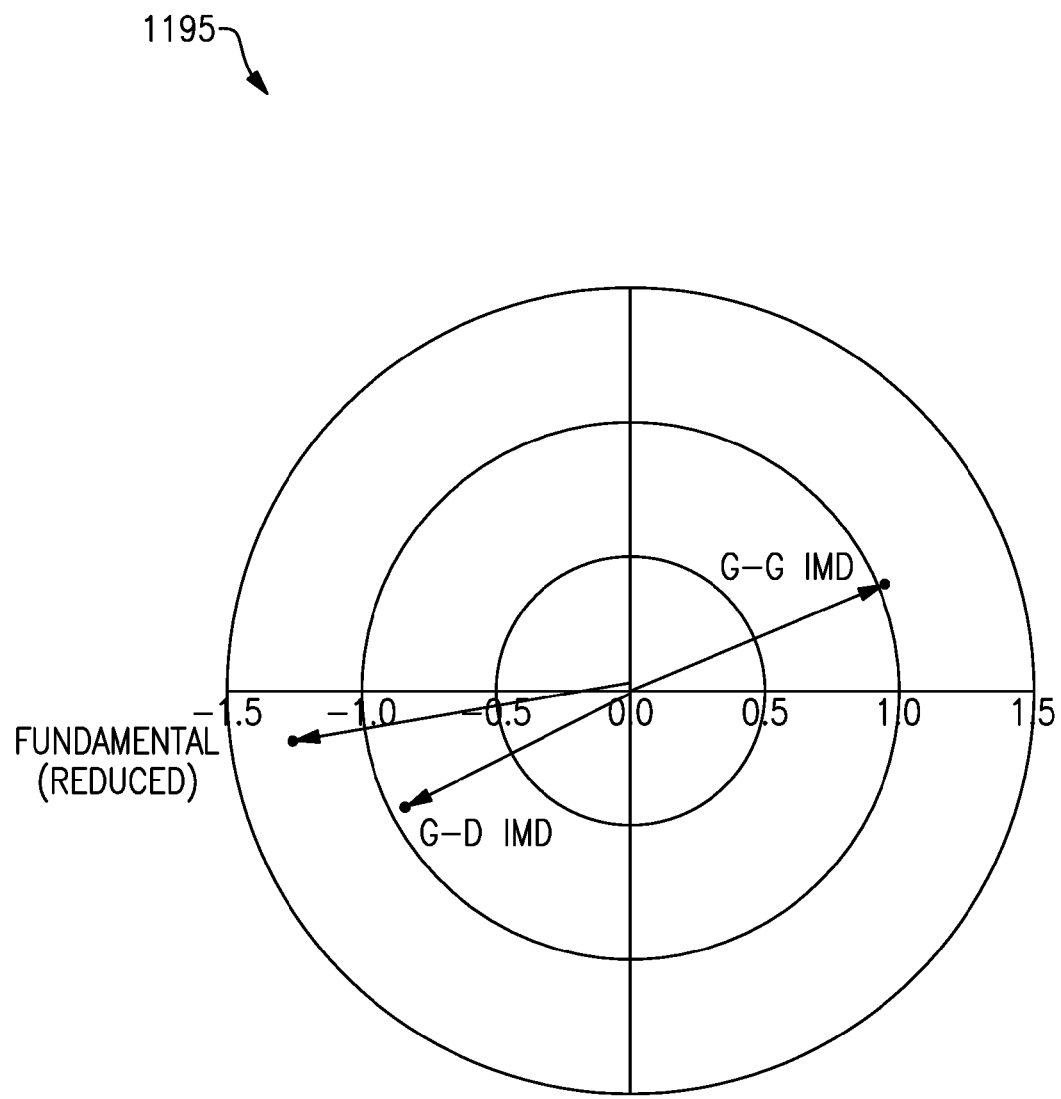
FIG. 11 is a polar plot illustrating the gate to gate intermodulation distortion and the gate to drain intermodulation distortion of the 3-tone harmonic balance simulation of FIG. 10, according to certain embodiments.
Figure 12A:
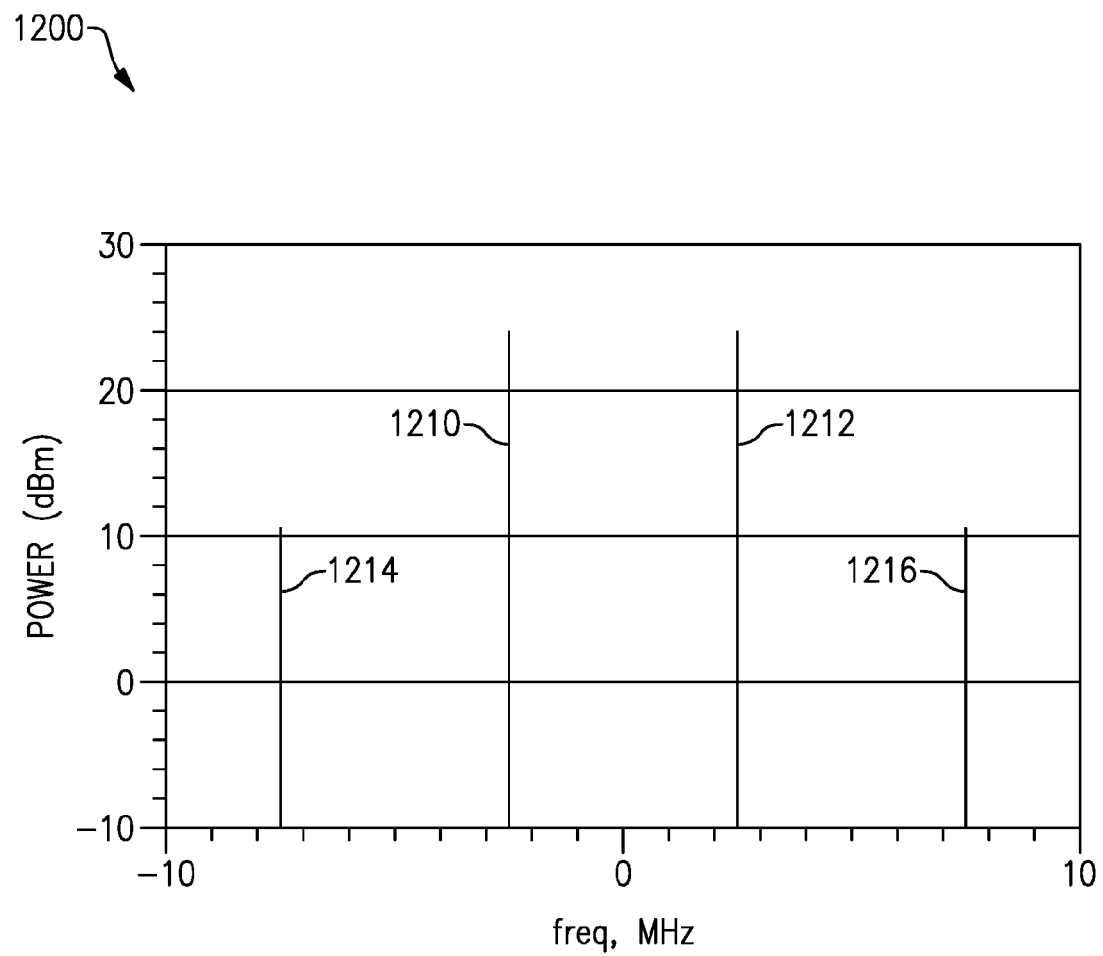
FIGS. 12A-12E are graphs illustrating the dependence of the intermodulation distortion on the magnitude of the gate to drain voltage, according to certain embodiments.
Figure 12B:
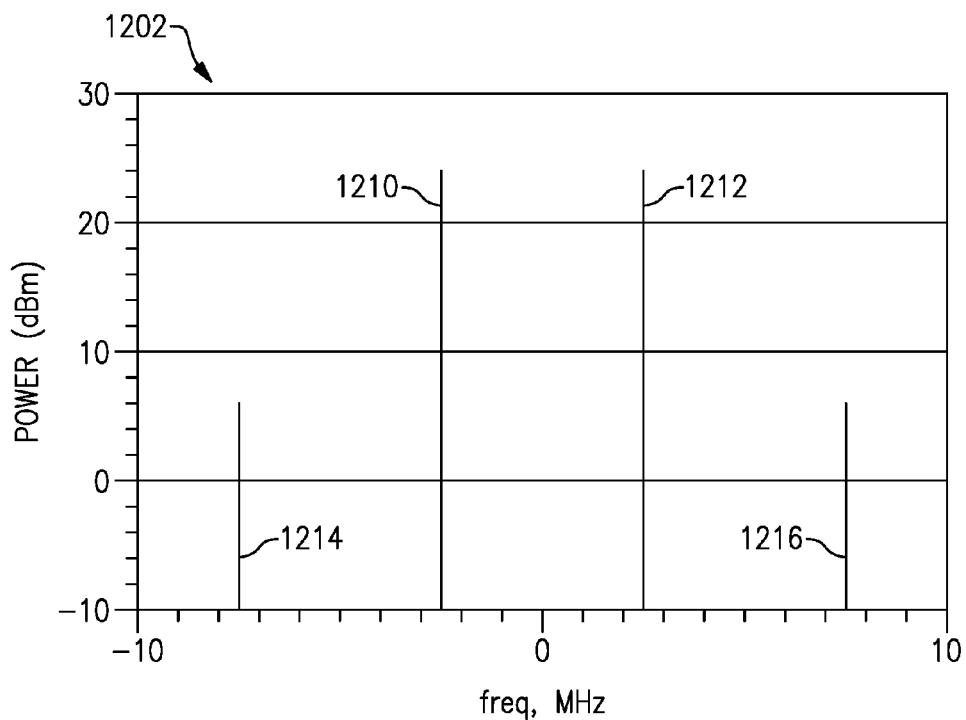
Figure 12C:
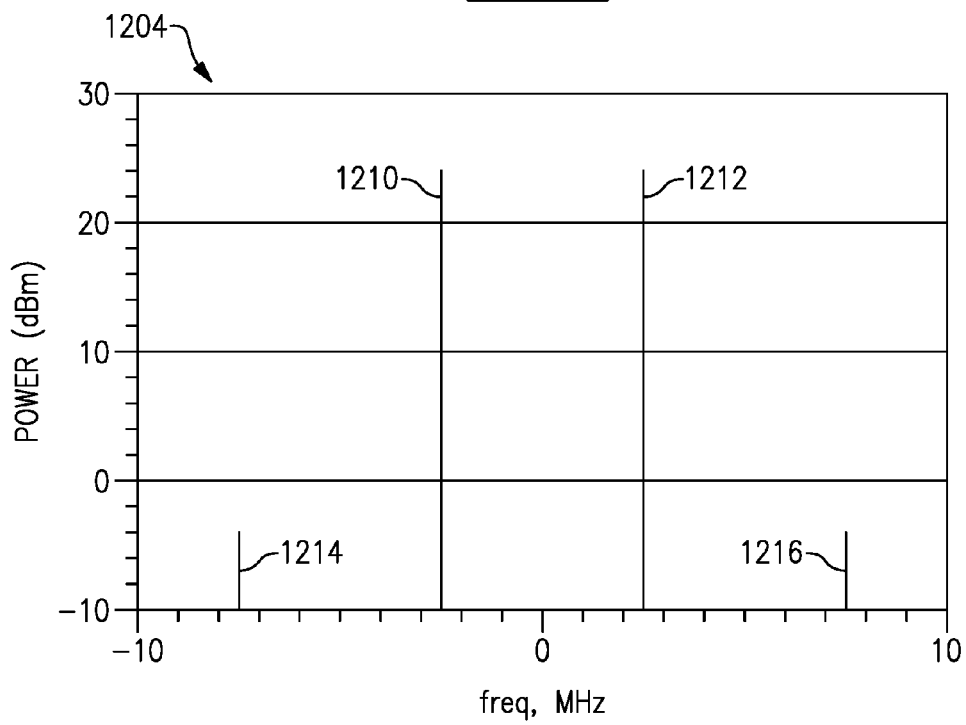
Figure 12D:
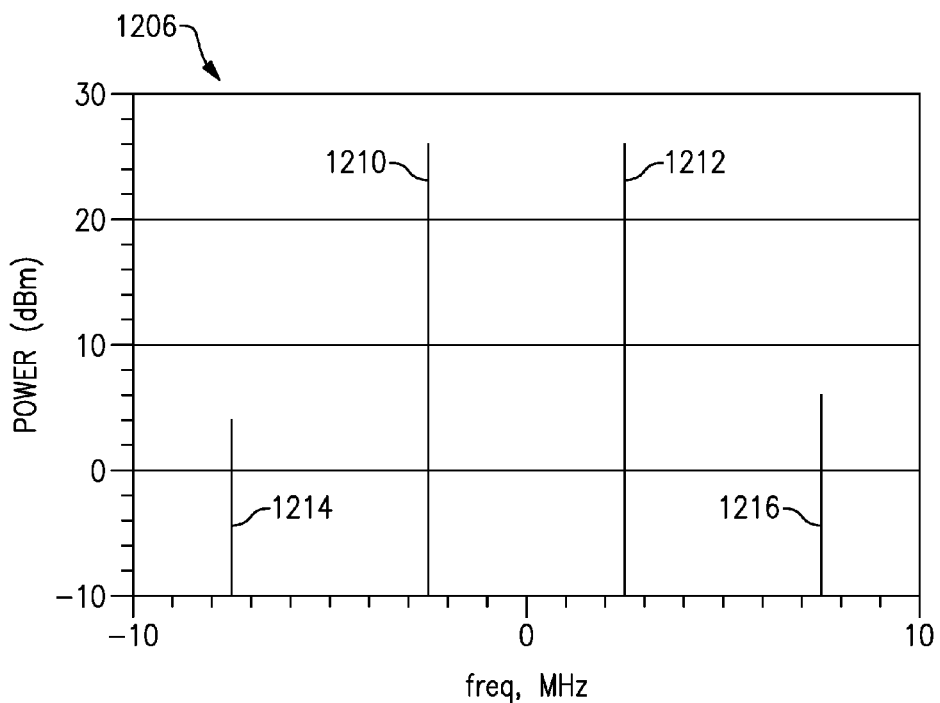
Figure 12E:
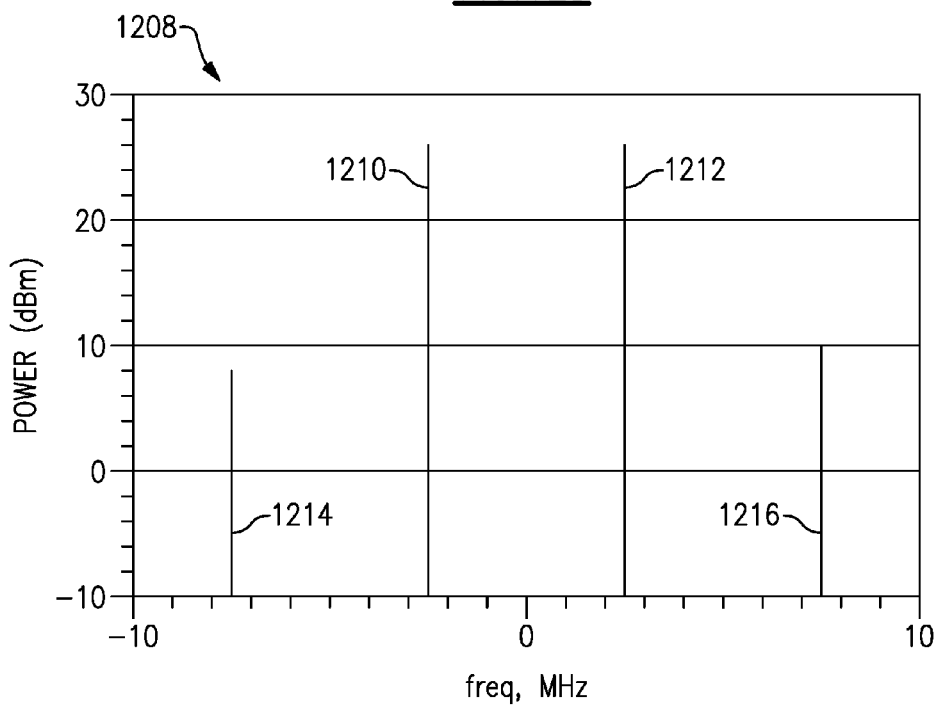
Figure 13A:
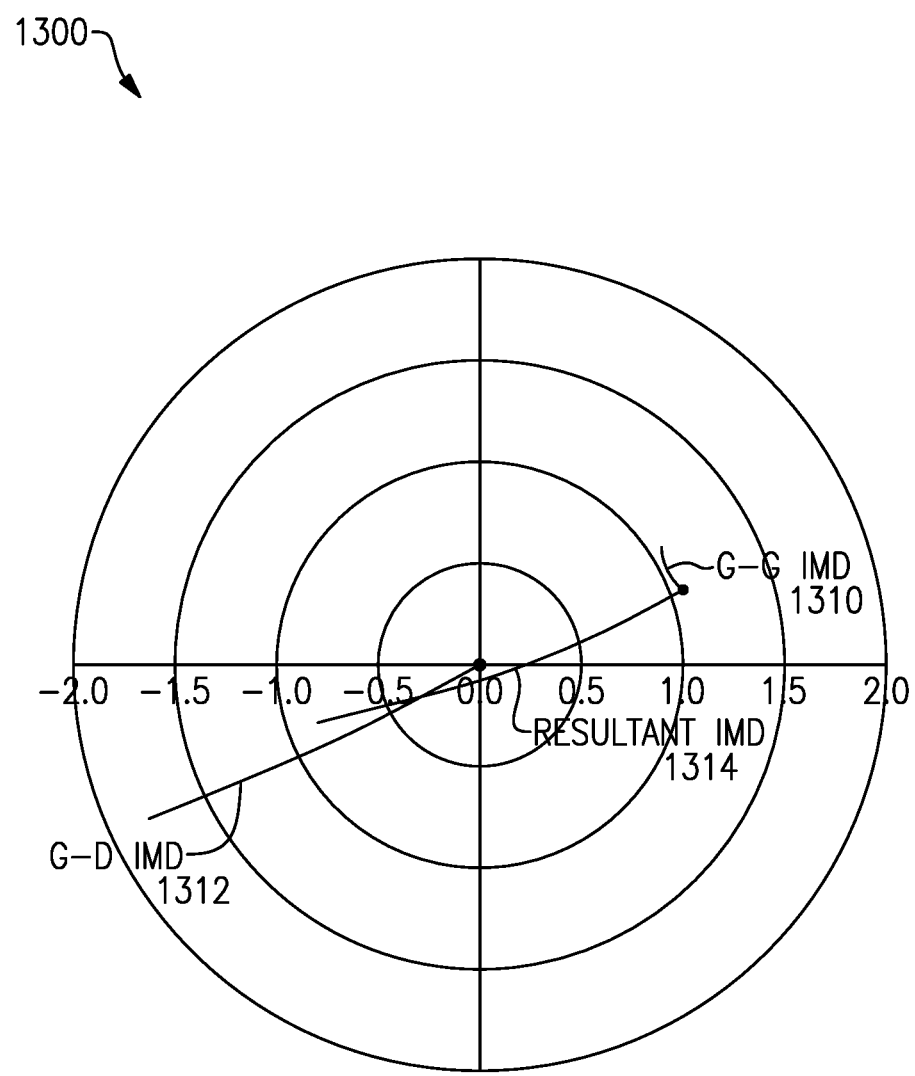
FIGS. 13A-13E are polar plots illustrating the dependence of the intermodulation distortion on the magnitude of the gate to drain voltage, according to certain embodiments.
Figure 13B:
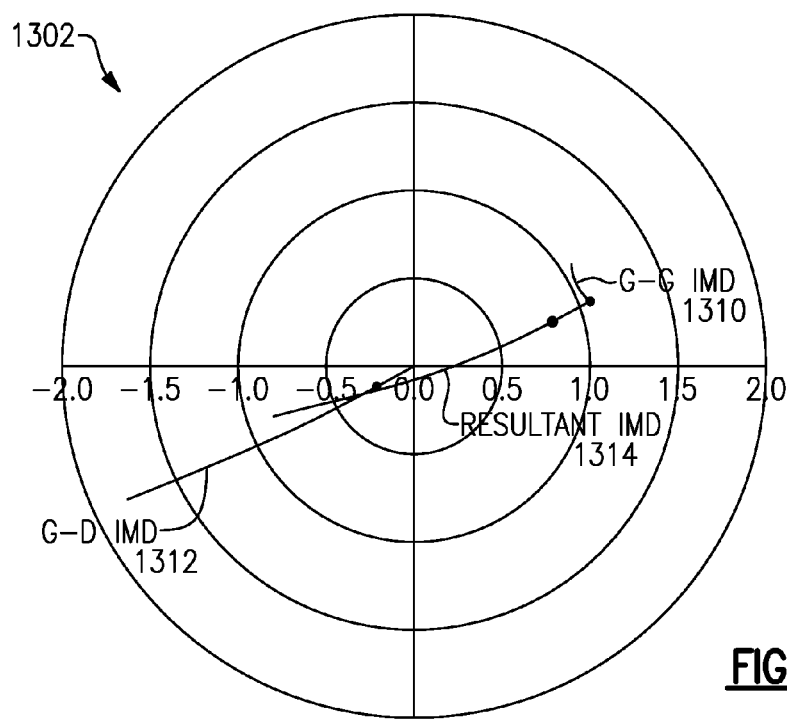
Figure 13C:
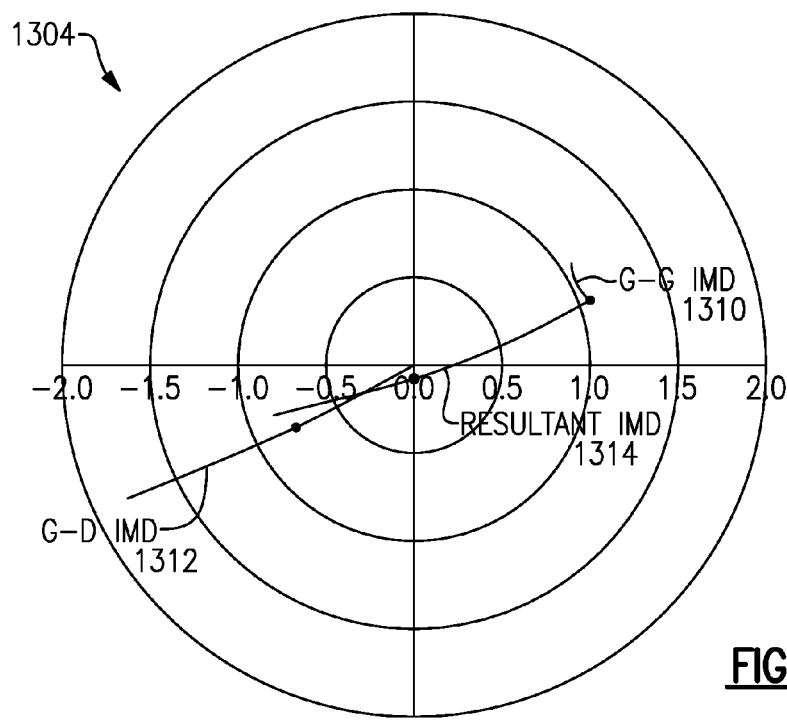
Figure 13D:
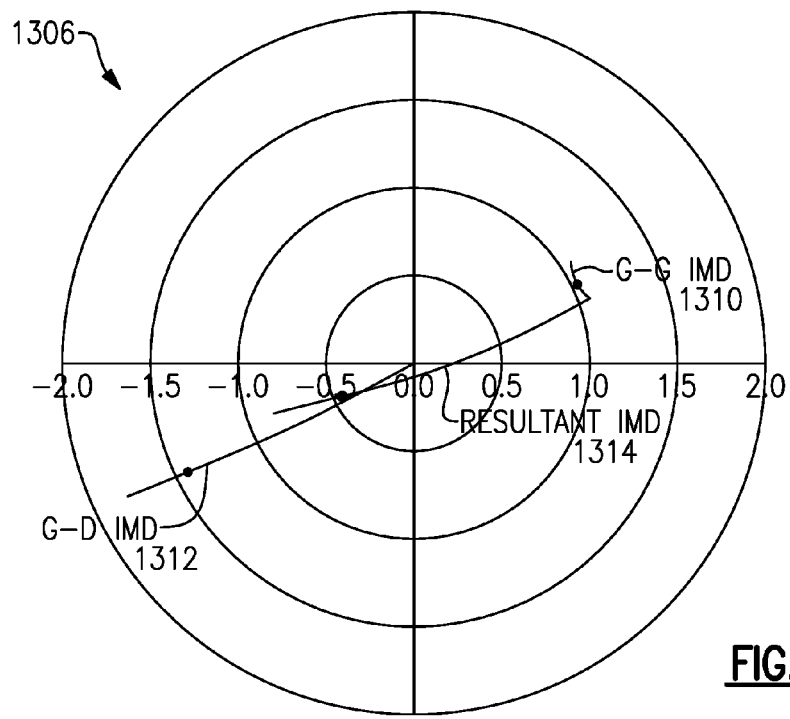
Figure 13E:
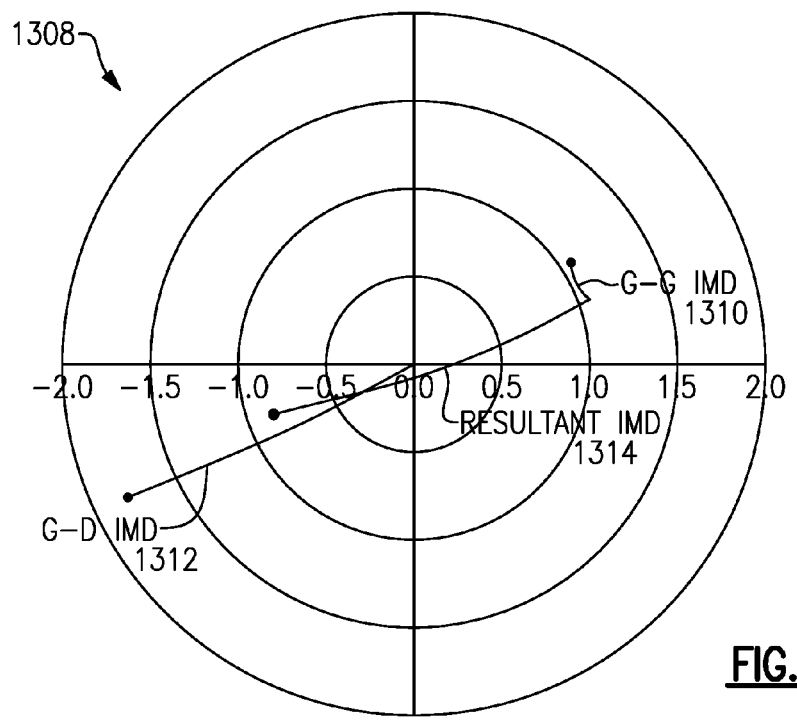

FIG. 11 is a polar plot 1195 of the 3-tone harmonic balance simulation of FIG. 10. The polar plot 1195 illustrates that G-G IMD and G-D IMD are substantially opposite in phase.

FIGS. 12A-12E are graphs 1200, 1202, 1204, 1206, 1208 illustrating the dependence of the intermodulation distortion on the magnitude of the drain signal voltage for the simulation of FIG. 10. Frequency in MHz is shown on the x-axis and signal power in dBm is shown on the y-axis of each graph 1200-1208. Traces 1210 and 1212 indicate the power levels of the ω1 and ω2 components in the output signal, and traces 1214 and 1216 indicate the power levels of the combined G-G IMD and the G-D IMD components, referred to as a resultant IMD, in the output signal.

As the amplitude of the ω3 signal is increased, the graphs 1200-1208 illustrate the IMD cancellation. As shown in FIGS. 12A-12E, as Ve increases, the power levels of the combined IMD signals 1214, 1216 decrease to a minimum (FIG. 12C), then begin to increase. There is an optimum Ve for which the combined IMD 1214, 1216 is a minimum. Or, in other words, there is an optimum envelope voltage, Ve of the ω3 signal that minimizes the IMD.

FIGS. 13A-13E are polar plots 1300, 1302, 1304, 1306, 1308 illustrating the dependence of the intermodulation distortion on the magnitude of the Ve for the simulation of FIG. 10. Trace 1310 indicates the path of the G-G IMD and trace 1312 indicates the path of the G-D IMD as the amplitude of the ω3 signal, Ve, is increased. Before the ω3 signal is injected, a resultant IMD 1314 is the same or approximately the same as the G-G IMD 1310. As the amplitude of the ω3 signal, Ve, is increased, the resultant IMD decreases to a minimum (FIG. 13C) and then begins to increase.

Figure 14:
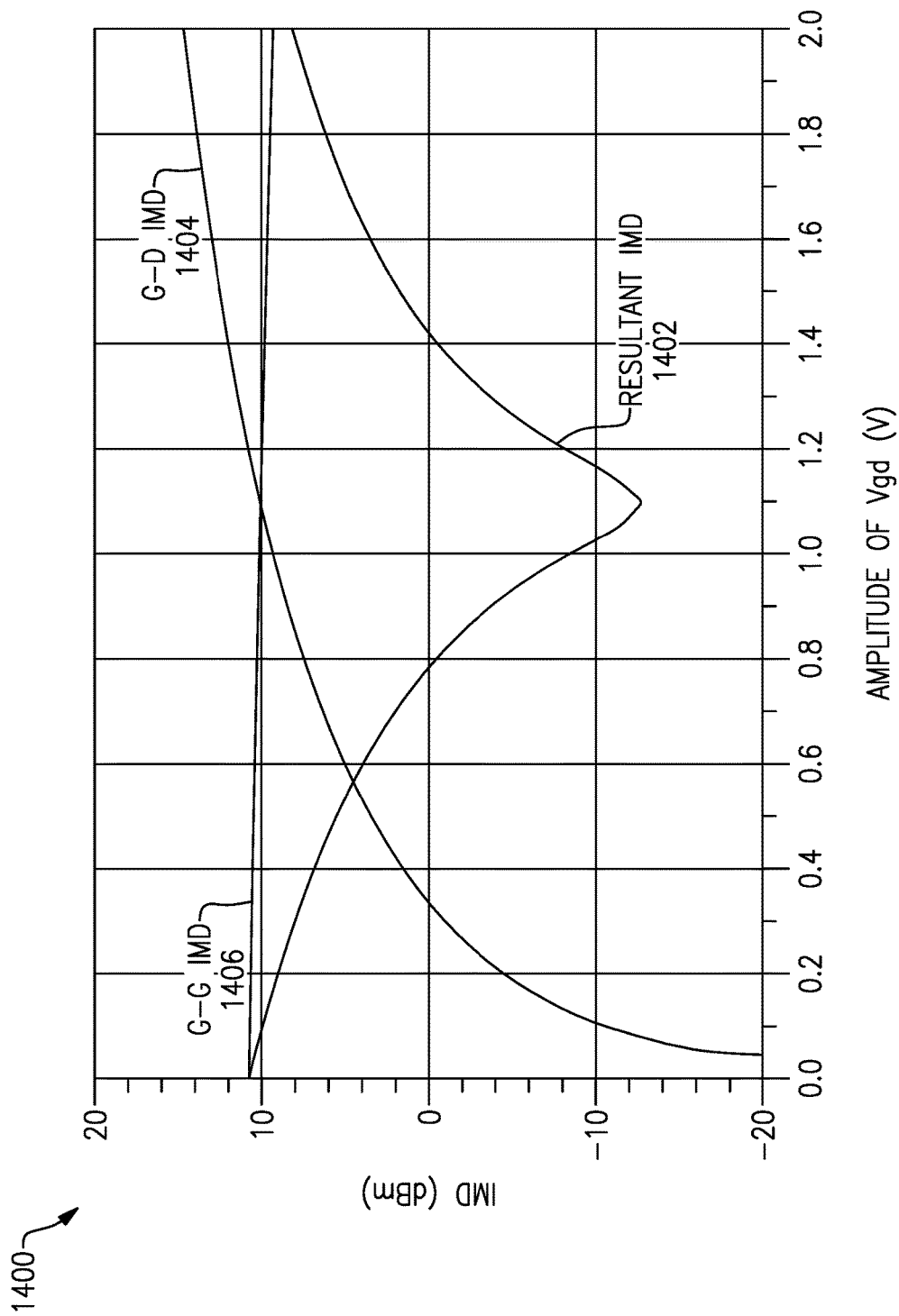
FIG. 14 is a graph illustrating the dependence of the intermodulation distortion on the magnitude of the gate to drain voltage, according to certain embodiments.

FIG. 14 is a graph 1400 illustrating the dependence of a resultant IMD 1402 on the amplitude of Ve. The amplitude, in volts, of Ve is shown on the x-axis and signal power of the IMD, in dBm, is shown on the y-axis. As Ve is swept, G-D IMD 1404 increases from approximately −20 dBm to approximately 16 dBm, G-G IMD 1406 remains relatively constant at approximately 10 dBm, and the resultant IMD 1402 decreases from approximately 10 dBm to approximately −12 dBm before increasing to approximately 9 dBm. Trace 1402 indicates that there is an optimum Ve to maximize IMD cancellation.

Figure 15:
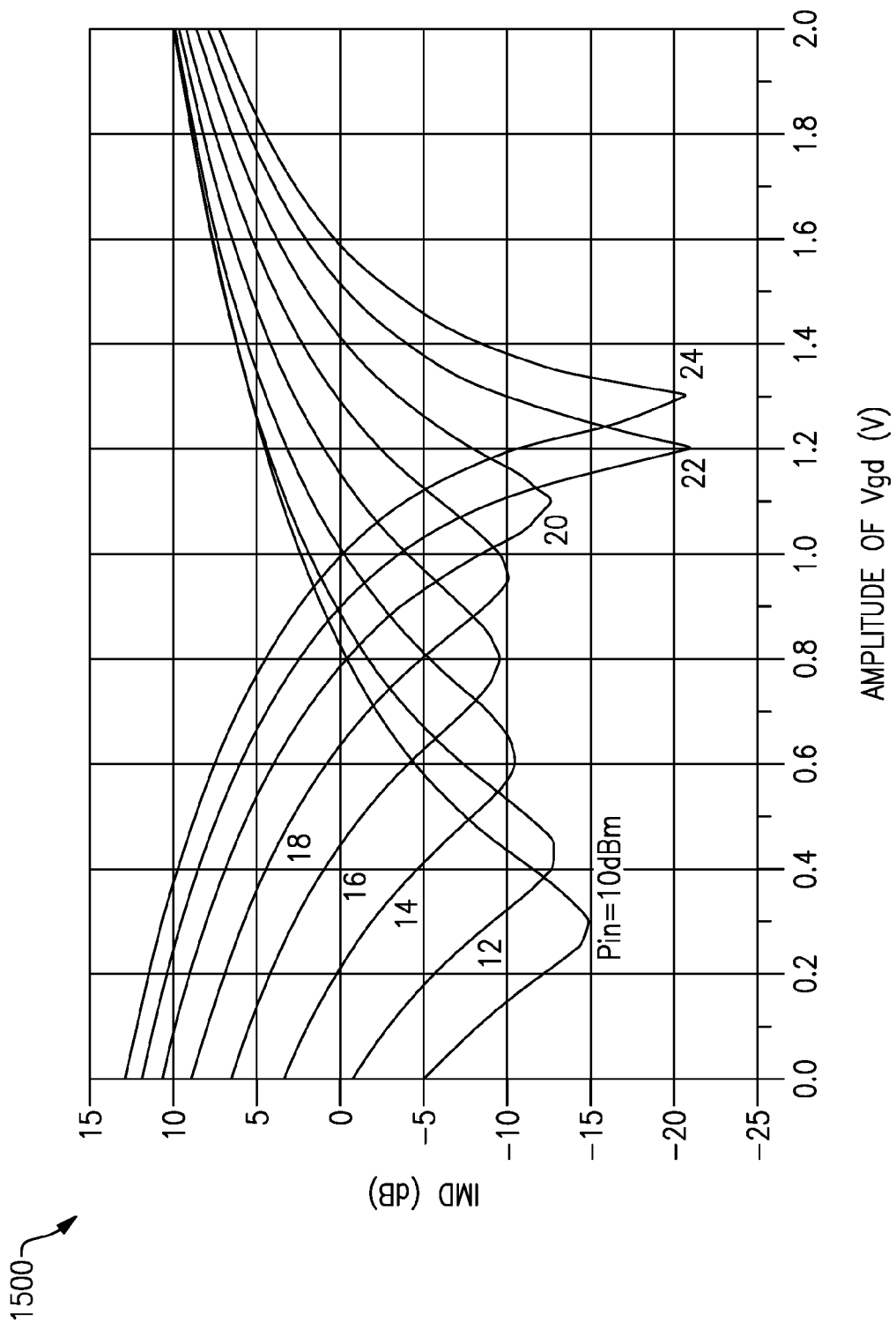
FIG. 15 is a graph illustrating the dependence of the intermodulation distortion on the magnitude of the gate to drain voltage with different input powers, according to certain embodiments.

FIG. 15 is a graph 1500 illustrating the dependence of the intermodulation distortion on the magnitude of the Ve, with different input power, Pin. The amplitude, in volts, of Ve is shown on the x-axis and signal power of the IMD, in dBm, is shown on the y-axis. Graph 1500 comprises a series of curves, of the resultant IMD as Ve is swept. Each curve represents a different power level of the input signal. The Pin begins at approximately 10 dBm and increases by approximately 2 dBm. The last resultant IMD curve was generated at an input power of approximately 24 dBm. Referring to FIG. 15, when the input power changes, the intrinsic IMD changes. As the power of the input signal increases from approximately 10 dBm to approximately 24 dBm, the amplitude of the ω3 signal, Ve, which minimizes the resultant IMD increases from approximately 0.3V to approximately 1.3V, respectively. Thus, as the input power increases, the amplitude of the ω3 signal, Ve, needs to increase to provide optimum IMD cancellation.

FIG. 16 is a graph 1600 illustrating the correlation between the optimal amplitude of the Ve and Pin. Optimum Ve increases with increasing Pin. The Pin, in dBm, is shown on the x-axis and optimum Ve, in volts, is shown on the y-axis. Optimum Ve at increasing Pin was measured using an exemplary power amplifier and the results plotted in trace 1602. The relationship between Ve and Pin was determined and is illustrated in trace 1604. For this power amplifier example, the relationship between Ve and Pin to minimize IMD is Ve=0.0753Pin−0.45. Other amplifiers may have different relationships between Ve and Pin for optimum IMD cancellation.

Figure 17A:
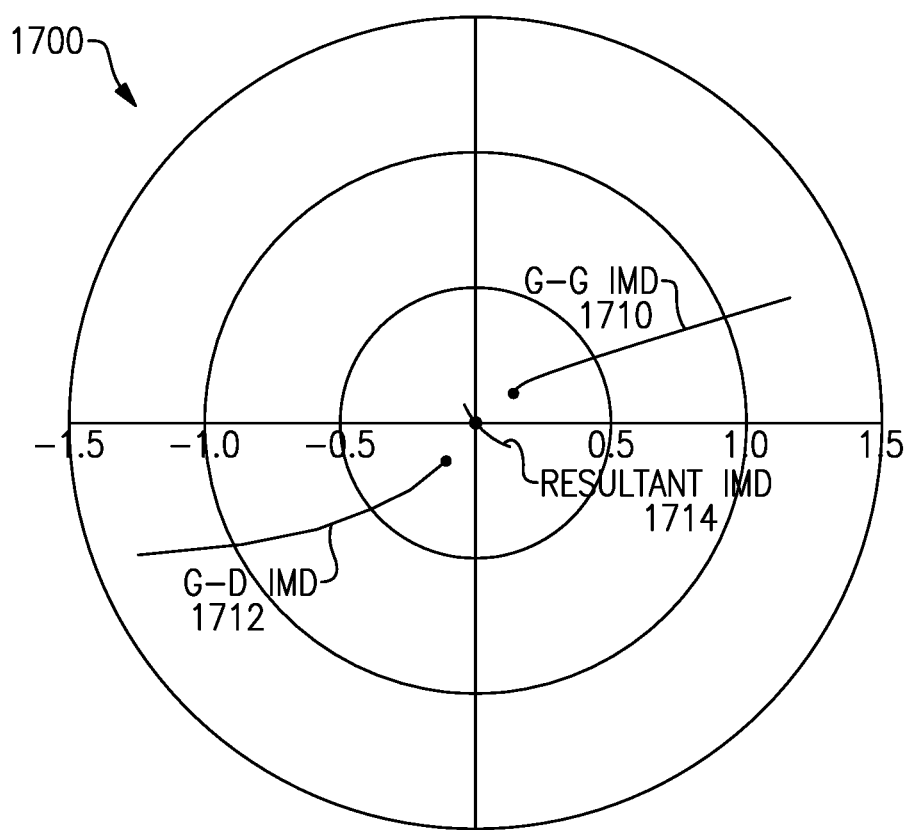
FIGS. 17A-17E are pole-zero plots illustrating the correlation between the optimal amplitude of the gate to drain voltage and input power, according to certain embodiments.
Figure 17B:
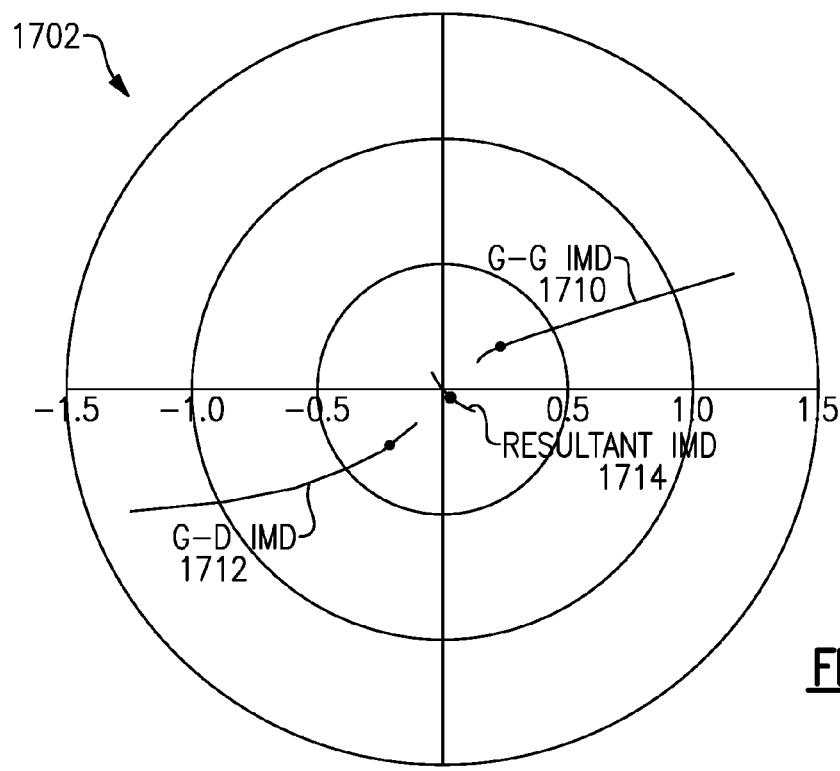
Figure 17C:
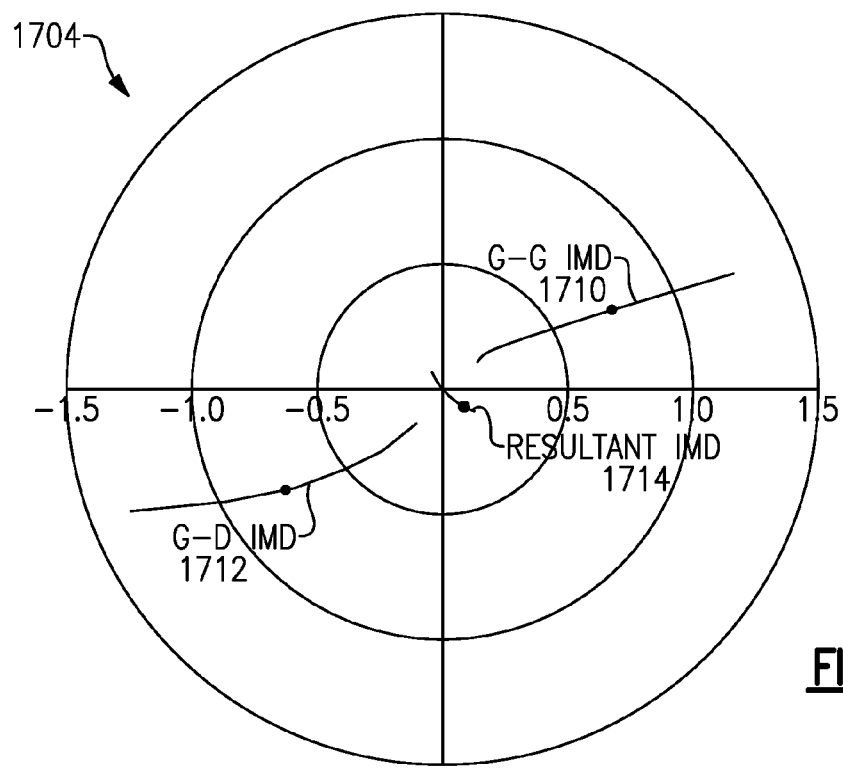
Figure 17D:
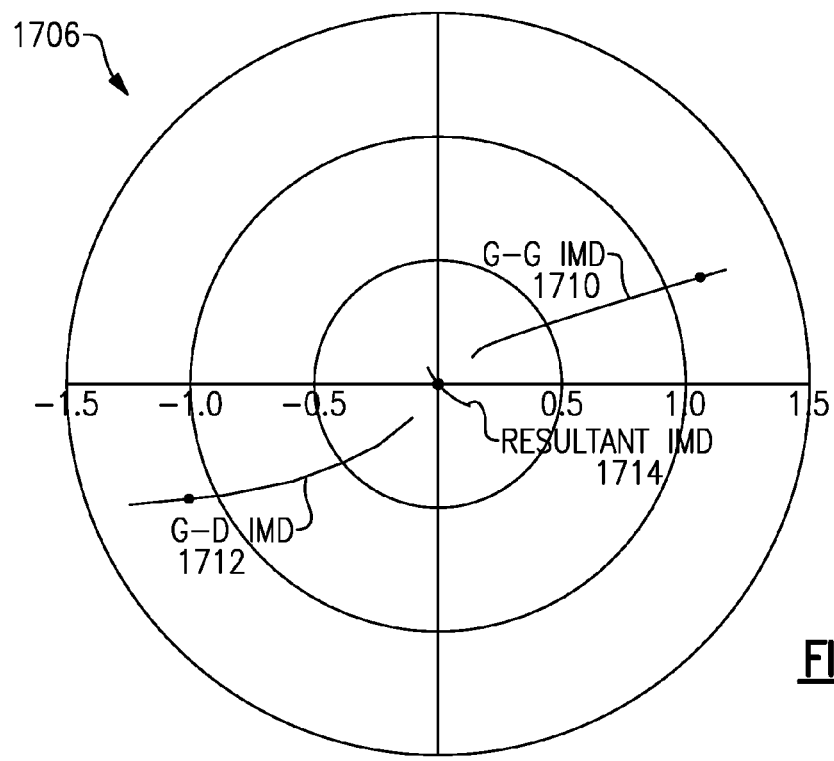
Figure 17E:
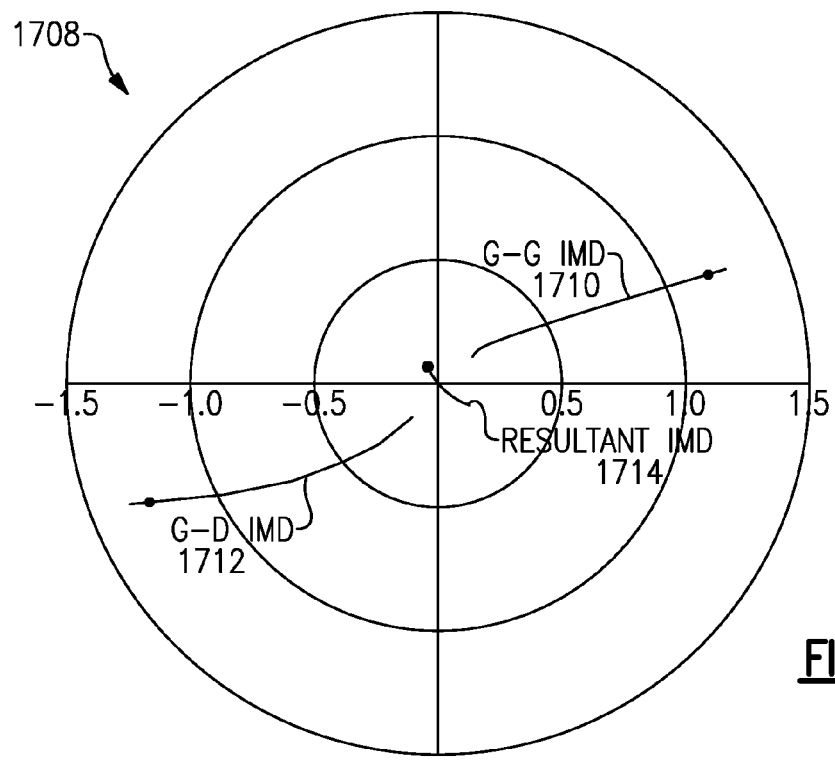

FIGS. 17A-17E are polar plots 1700, 1702, 1704, 1706, 1708 illustrating the correlation between the optimal Ve and Pin as the input power is swept. Trace 1710 indicates the path of G-G IMD and trace 1712 indicates the path of G-D IMD as Ve and Pin are increased during a sweep of Ve and Pin. At the beginning of the sweep, the G-G IMD and the G-D IMD are at an initial state, illustrated in FIG. 17A. During the sweep, the G-G IMD moves along path 1710 and the G-D IMD moves along path 1712 (FIGS. 17B-17D). At the end of the sweep, G-G IMD and G-D IMD are at a final state, illustrated in FIG. 17E. However, the resultant IMD 1714 remains at approximately zero during the sweep (FIGS. 17A-17E).

Figure 18:
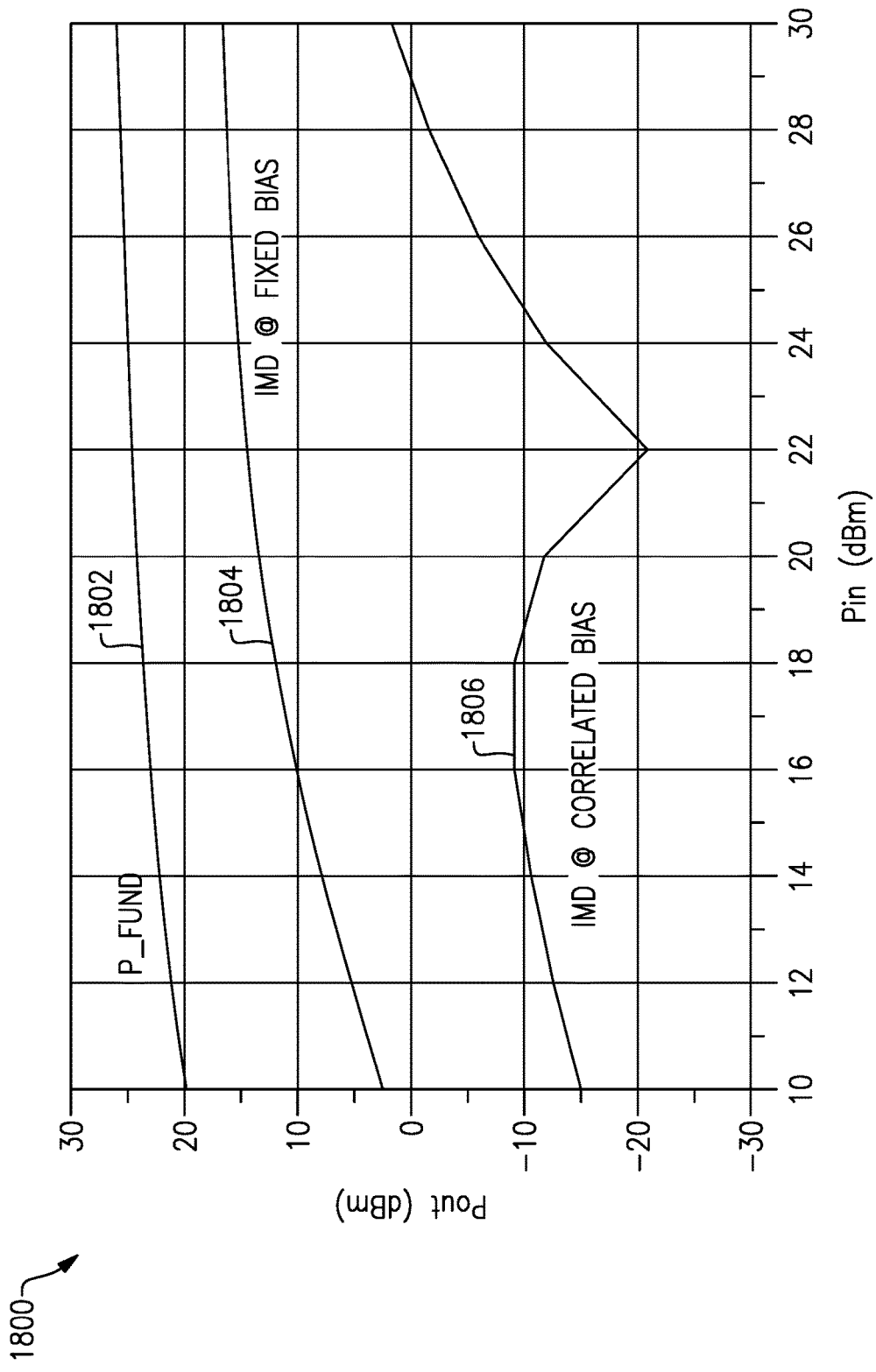
FIG. 18 is a graph illustrating the dependence of intermodulation distortion having correlated bias on the input power, according to certain embodiments.
Figure 19A:
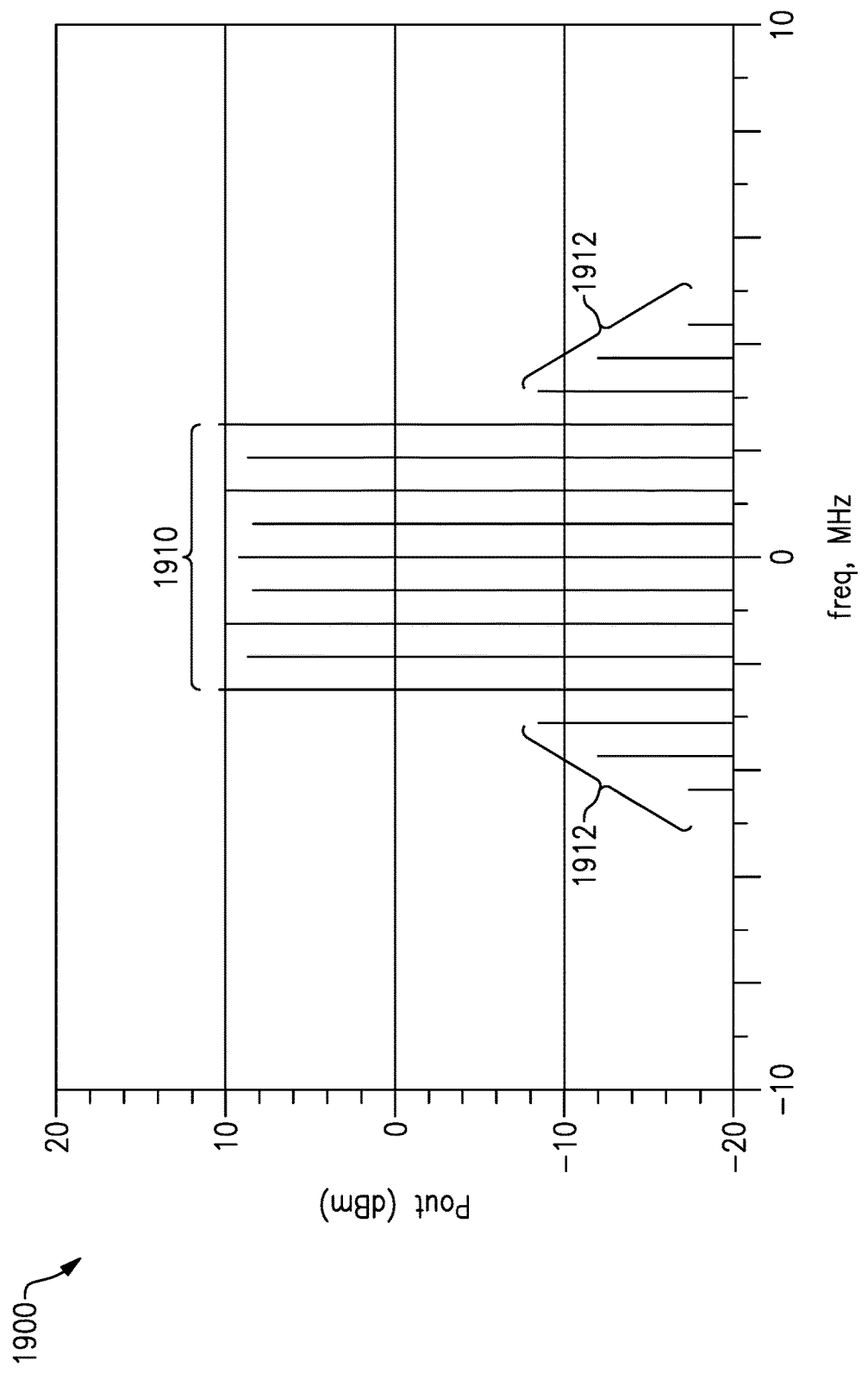
FIGS. 19A-19E are graphs illustrating intermodulation distortion cancellation for N-tone signals, according to certain embodiments.
Figure 19B:
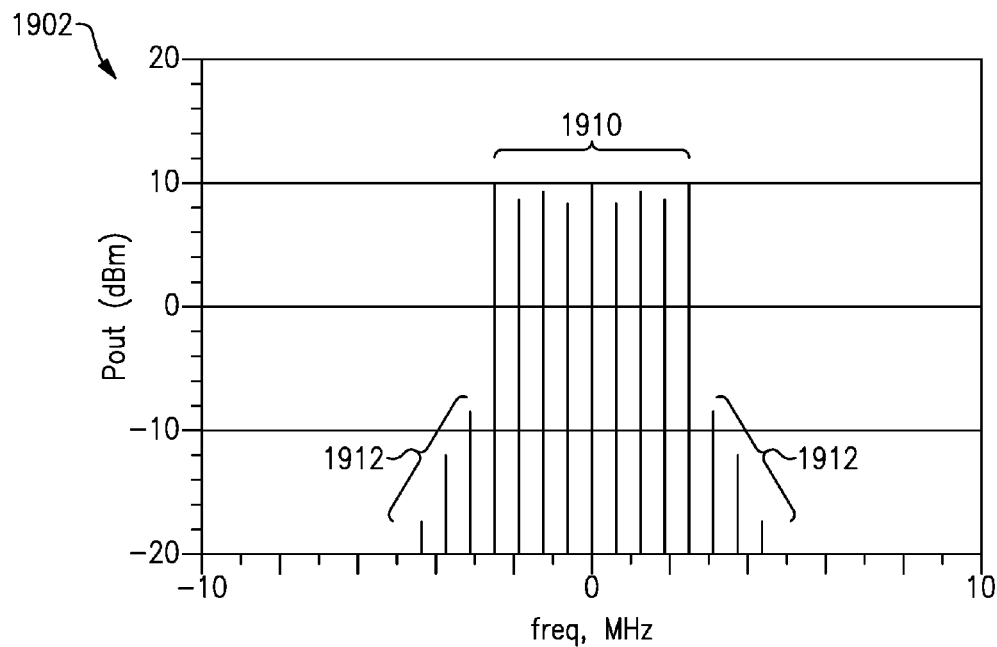
Figure 19C:
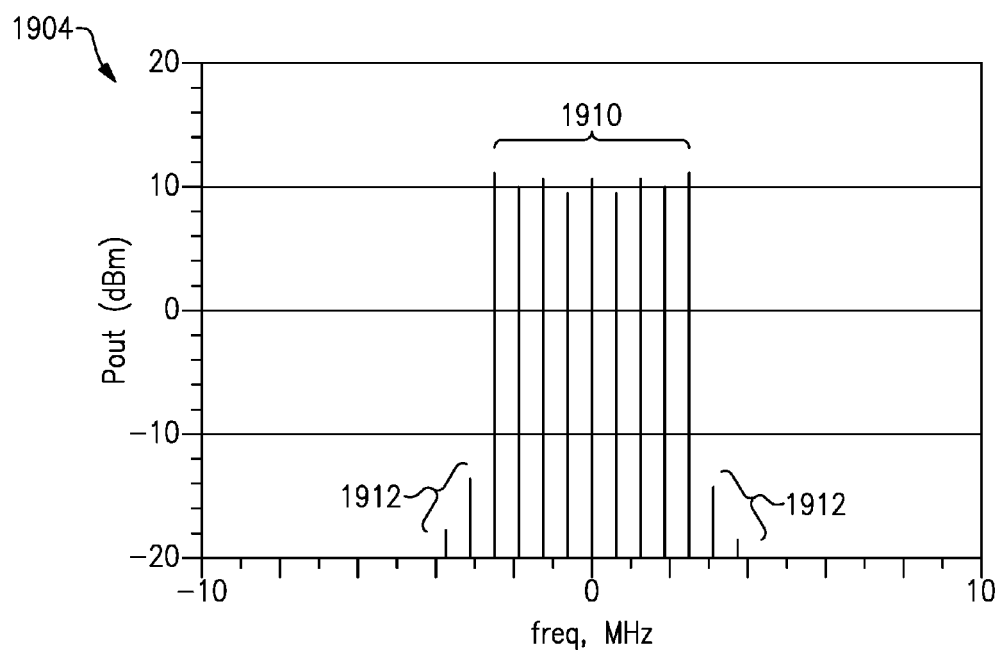
Figure 19D:
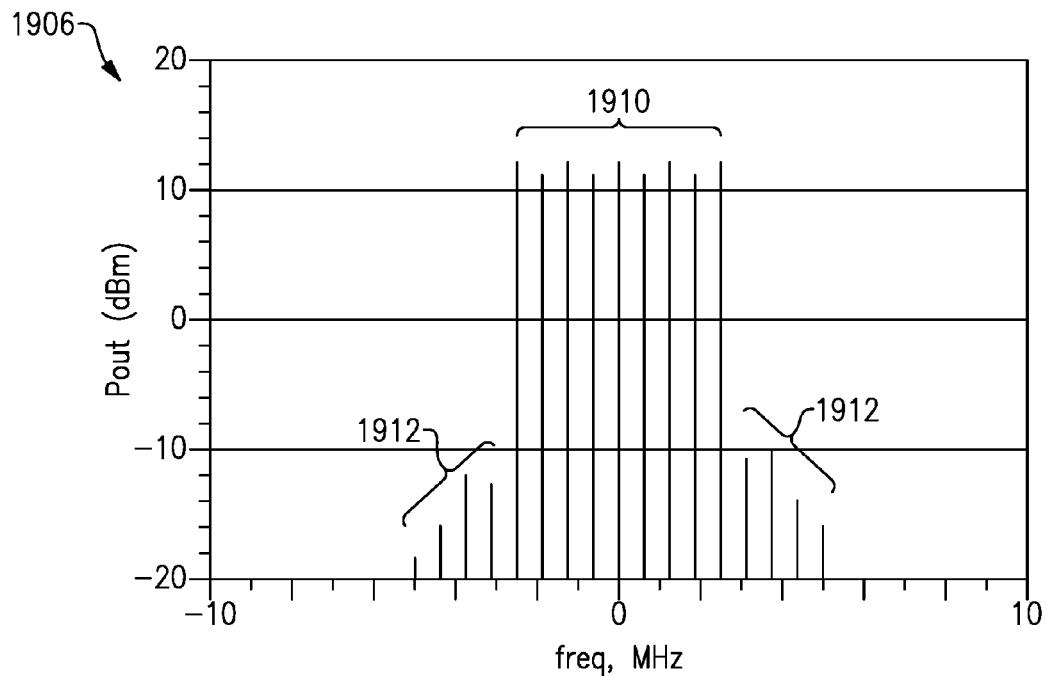
Figure 19E:
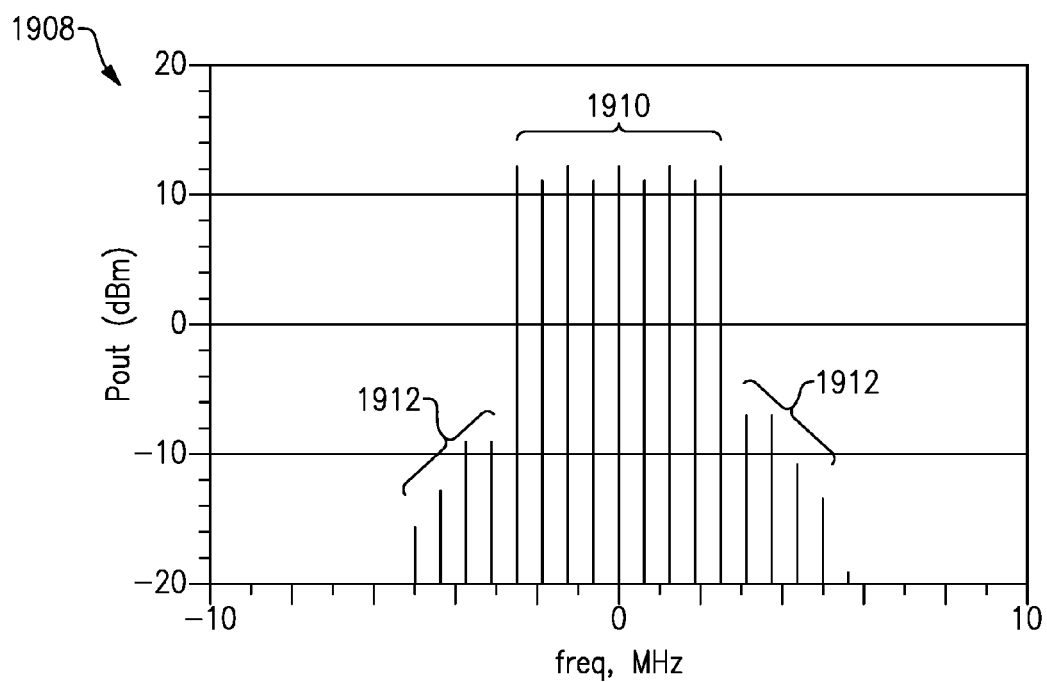

FIG. 18 is a graph 1800 illustrating the dependence of IMD on Pin. The input power Pin, in dBm, is shown on the x-axis, and the output power, Pout, in dBm, is shown on the y-axis. P_fund 1802 illustrates the output power of the fundamental frequency components of the output signal as the input power increases. IMD@fixed_bias 1804 illustrates the output power of the IMD components of the output signal where no ω3 signal is injected into the drain terminal of the amplifier 102 with a fixed or substantially fixed DC bias.

IMD@correlated_bias 1806 illustrates the output power of the resultant IMD components of the output signal where the ω3 signal is injected into the drain terminal of the amplifier 102 with amplitude that is correlated or substantially correlated to the input power. When the ω3 signal is correlated or substantially correlated to the input power, the resultant IMD is less than the resultant IMD associated with a fixed bias DC signal, over a range of Pin. In FIG. 18, the IMD@correlated_bias 1806 is at least 15 dBm less than IMD@fixed_bias 1804 over the range of Pin.

FIGS. 19A-19E are graphs 1900, 1902, 1904, 1906, 1908 illustrating intermodulation distortion cancellation for n-tone signals, where n≥2. In FIGS. 19A-19E, n=8. The frequency, in MHz, is shown on the x-axis, and the output power, in dBm, is shown on the y-axis.

In an embodiment, the n-tone signal is injected at the gate terminal of the amplifier 102. The frequencies of the n-tone signal are ω1, ω1+Δω, ω1+2Δω, . . . , ω1+(n−1)Δω, respectively. A n−1 tone signal, with the frequencies of Δω, 2Δω, . . . , and (n−1) Δω, respectively, is injected at the drain terminal of the amplifier 102. The output signal at the output terminal of the amplifier 102 comprises fundamental frequency components 1910 and IMD components 1912.

In an embodiment, the G_G IMD generated by an amplifier amplifying a two-tone input signal can be minimized by injecting a signal into the drain of the amplifier where the frequency of the drain injected signal is approximately equal to the difference in frequency between the two input tones and the magnitude and the phase of the drain injected signal is correlated to the power level of the two-tone input signal.

The linearity of an amplifier can be improved by reducing the third order intermodulation distortion caused by the intermodulation products generated by a two-tone input signal. At least a portion of the intermodulation products can be canceled by injecting a signal into the drain or collector of the amplifier where the signal comprises a frequency approximately equal to the difference in frequency between the two input tones and the signal has an amplitude that varies in synchronism with the envelope of the input signal.

Figure 20:
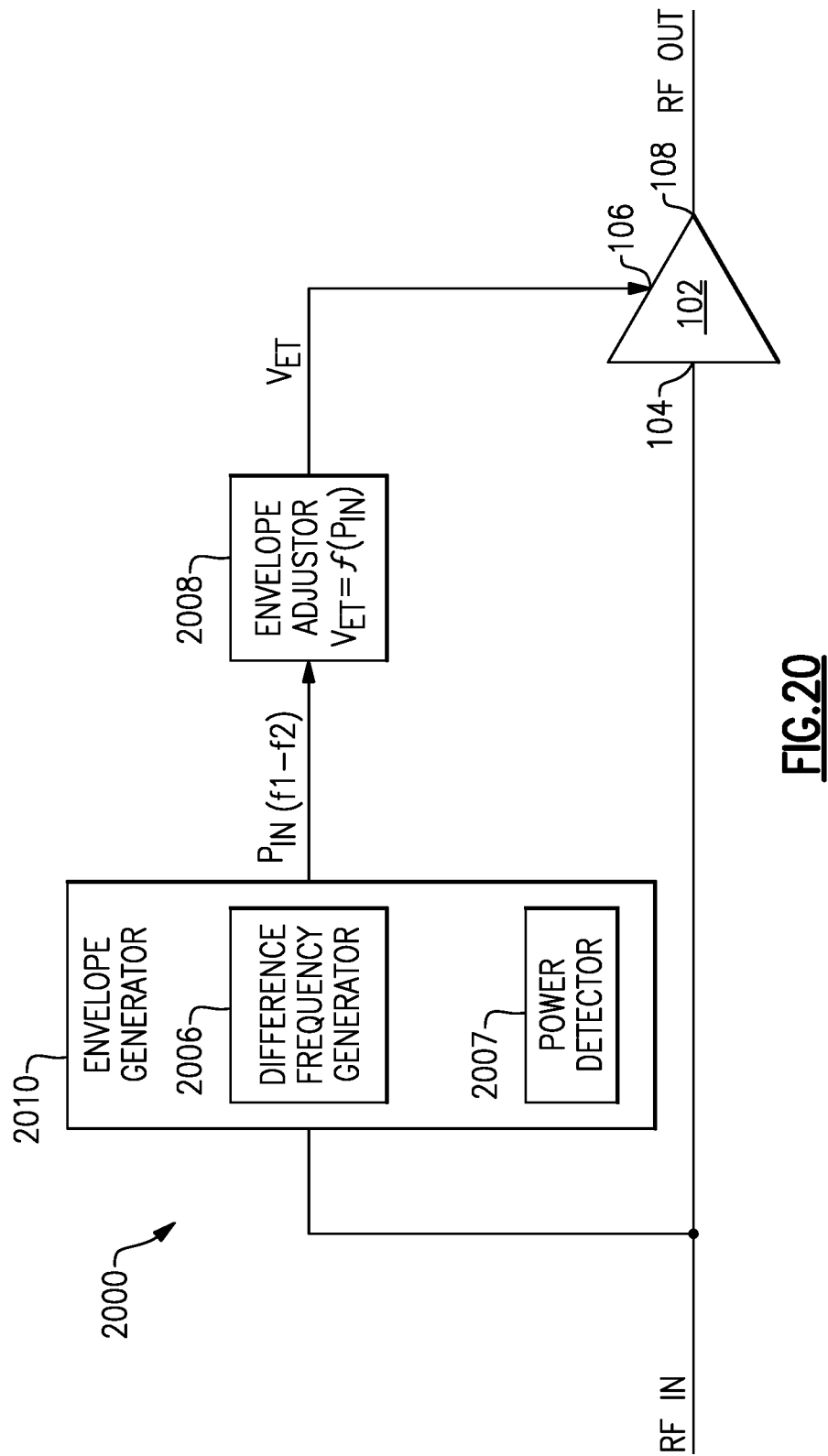
FIG. 20 is a schematic diagram of an exemplary linearization circuit, according to certain embodiments.

FIG. 20 is a block diagram of an exemplary linearization circuit 2000 configured to cancel at least a portion of third order intermodulation distortion to improve linearity of the amplifier 102. The linearization circuit 2000 comprises an envelope adjustor 2008 and an envelope generator 2010. In an embodiment, the envelope generator 2010 comprises a difference frequency generator 2006 and a power detector 2007. In an embodiment, the difference frequency generator 2006 comprises a de-modulator, an envelope detector, or the like.

In an embodiment, an input signal RF IN comprises at least a first frequency f1 and a second frequency f2 and has a power level $P_{IN}$. The envelope generator 2010 receives the input signal RF IN and outputs an output signal comprising a difference signal having a difference frequency f1-f2 and an envelope that is based at least in part on the power level $P_{IN}$ of the input signal RF IN.

In an embodiment, the envelope adjuster 2008 of the linearization circuit 2000 dynamically adjusts the amplitude of the difference signal (f1-f2) to track the RF envelope ($P_{IN}$) of the input signal (RF IN) at high instantaneous power. The adjusted signal ($V_{ET}$) is injected or applied to the drain or collector terminal 106 of the amplifier 102 to cancel at least a portion of the third order intermodulation distortion (IMD3) in the amplifier output signal (RF OUT). The adjusted signal $V_{ET}$ comprises the envelope tracking voltage.

The amplifier 102 receives the input signal RF IN at an input terminal 104 and the envelope tracking voltage $V_{ET}$ at a drain terminal 106 and generates an amplifier output signal RF OUT at an output terminal 108. In an embodiment, the amplifier output signal RF OUT comprises an amplified input signal. The amplifier 102 mixes the first and second frequency components of the amplifier input signal RF IN to generate intermodulation products of f1 and f2 in the amplifier output signal RF OUT. The application of the envelope tracking voltage $V_{ET}$ to the drain terminal 106 of the amplifier 102 cancels at least a portion of the intermodulation products in the amplifier output signal RF OUT to improve amplifier linearity. In an embodiment, the injection of the envelope tracking voltage $V_{ET}$ to the drain terminal 106 cancels at least a portion of the third order f1 and f2 intermodulation products in the amplifier output signal RF OUT. In another embodiment, the injection of the envelope tracking voltage $V_{ET}$ to the drain terminal 106 cancels at least a portion of the fifth order f1 and f2 intermodulation products in the amplifier output signal RF OUT.

In other words, without the application of the envelope tracking voltage $V_{ET}$ to the drain terminal 106 of the amplifier 102, the amplifier output RF OUT comprises more intermodulation products and the amplifier 102 has reduced linearity because the cancelling effect of the envelope tracking voltage $V_{ET}$ on the intermodulation products is not present.

In an embodiment, the envelope adjustor 2008 comprises a shaping function to generate the envelope tracking voltage $V_{ET}$ representing the magnitude of the envelope of the difference signal. The magnitude of the envelope of the difference signal $V_{ET}$ is a function of the power in $P_{IN}$.

In another embodiment, the envelope adjuster 2008 comprises a shaping table to generate the envelope tracking voltage $V_{ET}$ representing the magnitude of the difference signal. The contents of the shaping table in the envelope path determine the mapping between the instantaneous RF envelope and the applied $V_{ET}$. It is this mapping that provides at least some cancellation of the third order and the fifth order intermodulation products. In an embodiment, input waveforms and a plurality of shaping functions are used to measure the third order intermodulation distortion over a plurality of combinations of input power and $V_{ET}$ to generate a shaping table for the amplifier 102.

Figure 21:
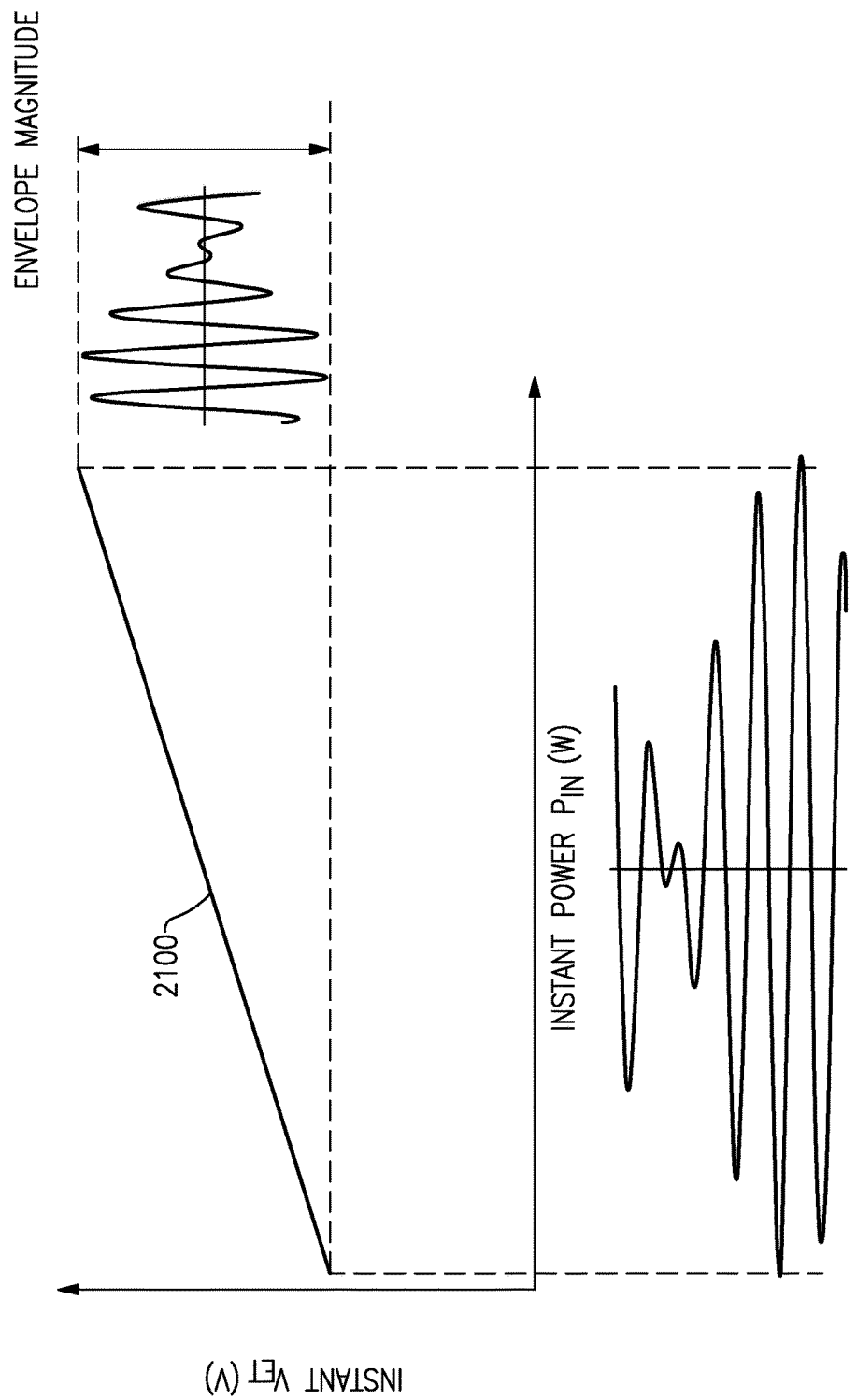
FIG. 21 is an exemplary graph illustrating the relationship between the envelope of the input signal and the shaping function, according to certain embodiments.

FIG. 21 is a graph illustrating an exemplary shaping function 2100 as the relationship between the instant $V_{ET}$ and the instant power $P_{IN}$ of the RF input signal. The instant power $P_{IN}$ in watts is shown on the x-axis and the instant $V_{ET}$ in volts is shown on the y-axis. In an embodiment, $V_{ET}$ is also described as the envelope tracking voltage.

In an embodiment, the shaping function 2100 is an adjustment of the envelope magnitude and the slope of the shaping function 2100 is equal to or approximately equal to the envelope magnitude. When the slope of the shaping function is zero, there is no envelope signal. As the slope of the shaping function 2100 increases, the envelope magnitude increases. To adjust the envelope, the envelope adjuster 2008 adjusts the slope of the shaping function.

Figure 22:
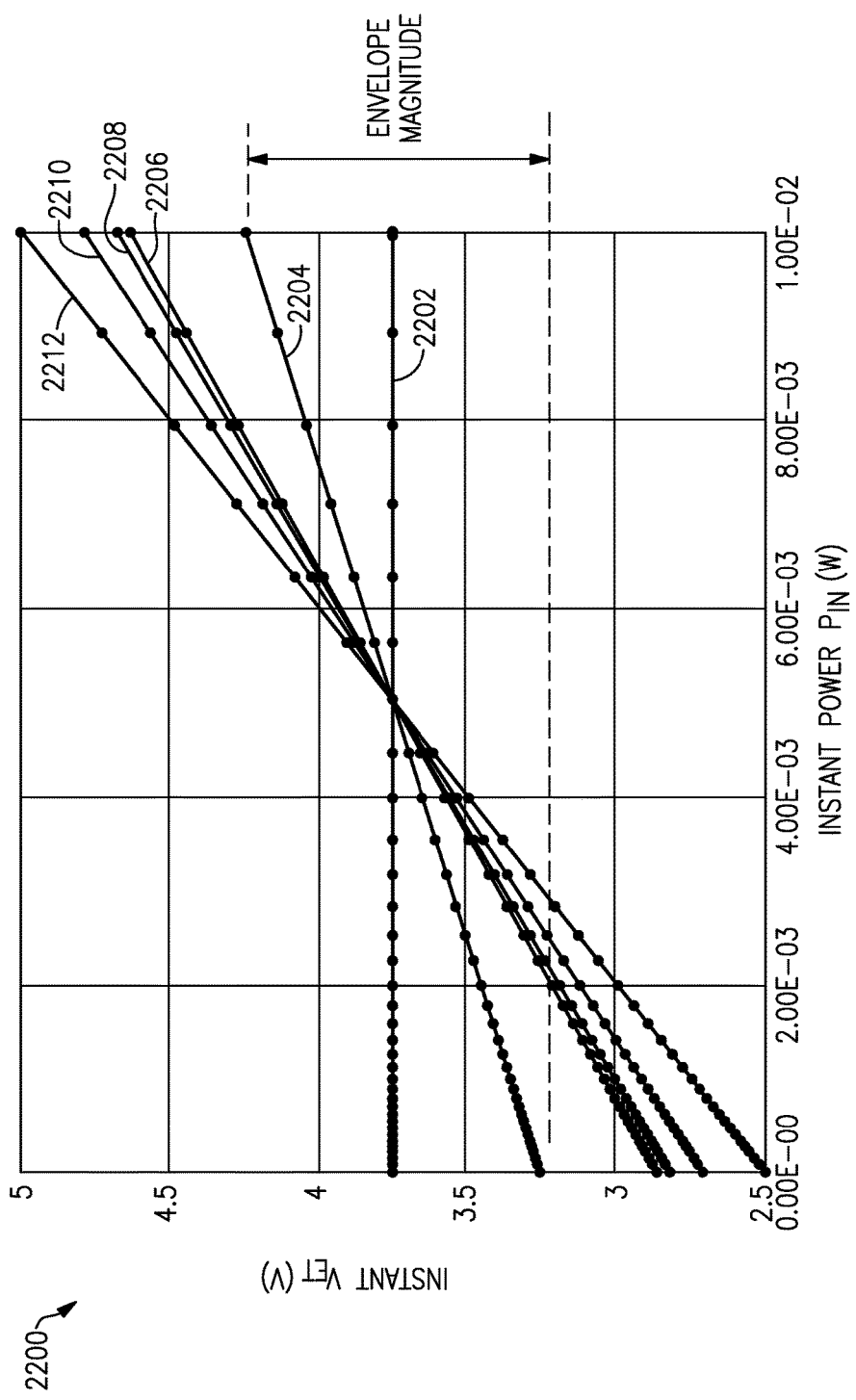
FIG. 22 is an exemplary graphical representation of a shaping table, according to certain embodiments.

FIG. 22 is a graph illustrating a plurality of shaping functions 2202, 2204, 2206, 2208, 2210, 2212, where each shaping function 2202, 2204, 2206, 2208, 2210, 2212 has a tuned slope. The instant power $P_{IN}$ in watts is shown on the x-axis and the instant $V_{ET}$ in volts is shown on the y-axis.

EXAMPLE 1

An envelope tracking test was performed on a test CMOS power amplifier 102 with the following conditions:
Vcc1=3.0 volts;
Vbias=0.23 volts;
Vcasc=2.7 volts;
Vcc2=2.5-5.0 volts;
Input Signal Frequency=2.6 GHz, chosen for maximum gain; and
2 tone test run with 2 tones 2 MHz apart (4 MHz spacing).

The linearization circuit 2000 applied the plurality of shaping functions 2202, 2204, 2206, 2208, 2210, 2212 to the CMOS power amplifier receiving the 2.6 GHz input signal with the 2 tones 2 MHz apart and the third order intermodulation distortion was measured.

Figure 23:
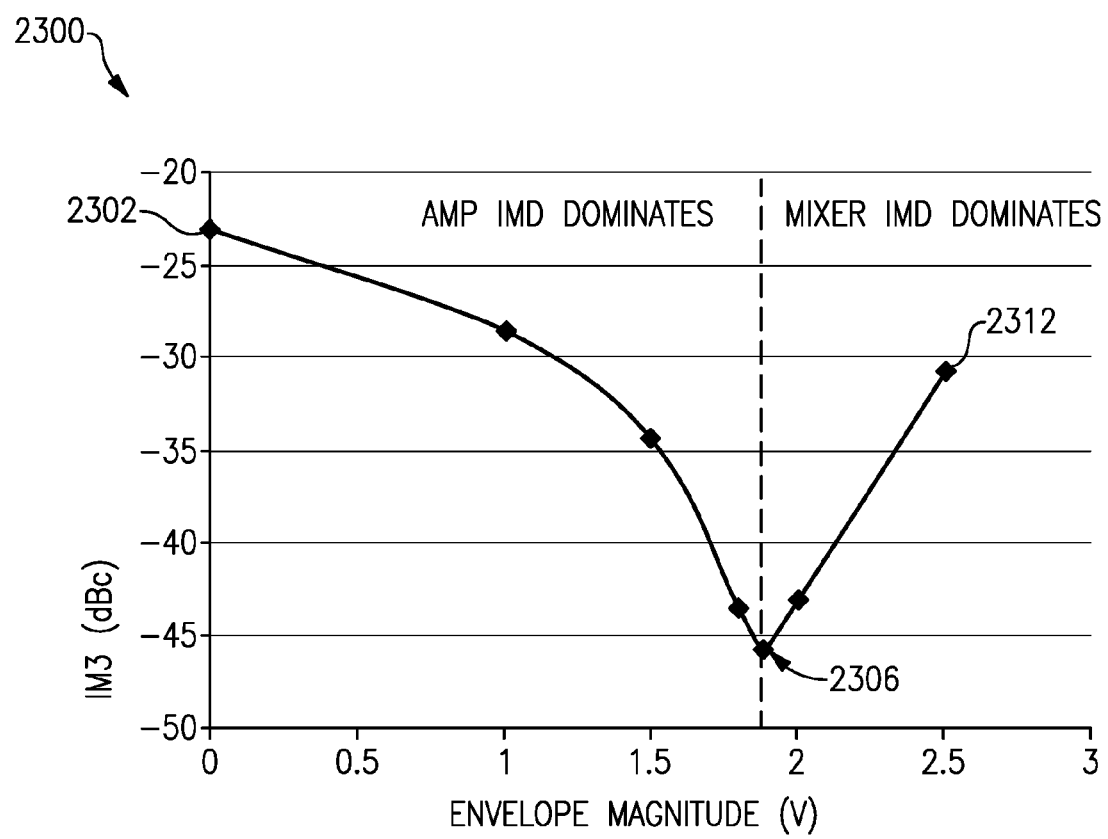
FIG. 23 is an exemplary graph illustrating the dependence of the third order intermodulation distortion on the envelope magnitude, according to certain embodiments.

FIG. 23 is an exemplary graph 2300 illustrating the dependence of the third order intermodulation distortion on the envelope magnitude, which is dependent upon the slope of the shaping function. The envelope magnitude in volts is shown on the x-axis and the third order intermodulation distortion (IM3) in dBc is shown on the y-axis, where dBc is the power ratio of a signal to a carrier signal.

For example, the measurement 2302 illustrates the maximum third order intermodulation distortion when the shaping function 2202 (slope=0) is applied. The measurement 2312 illustrates the third order intermodulation distortion when the shaping function 2212 is applied. The shaping function 2212 has the greatest slope of the plurality of shaping functions 2202, 2204, 2206, 2208, 2210, 2212 illustrated in graph 2200. The measurement 2306 illustrates the minimum third order intermodulation distortion when the tuned slope 2206 is applied.

To the left of the vertical dashed line in FIG. 23, the amplifier intermodulation dominates the third order intermodulation distortion and to the right of the vertical dashed line the mixed intermodulation dominates. Thus, when the instantaneous input power is high, the instantaneous $V_{ET}$ determines the third order intermodulation distortion of the amplifier 102 and when the instantaneous input power is low, the amplifier intermodulation determines the third order intermodulation distortion.

FIG. 24A is a plot 2400 of output signal power (y-axis) verses frequency (x-axis) for the test CMOS power amplifier without linearization, where Vdd=3.75 V.

Figure 24B:
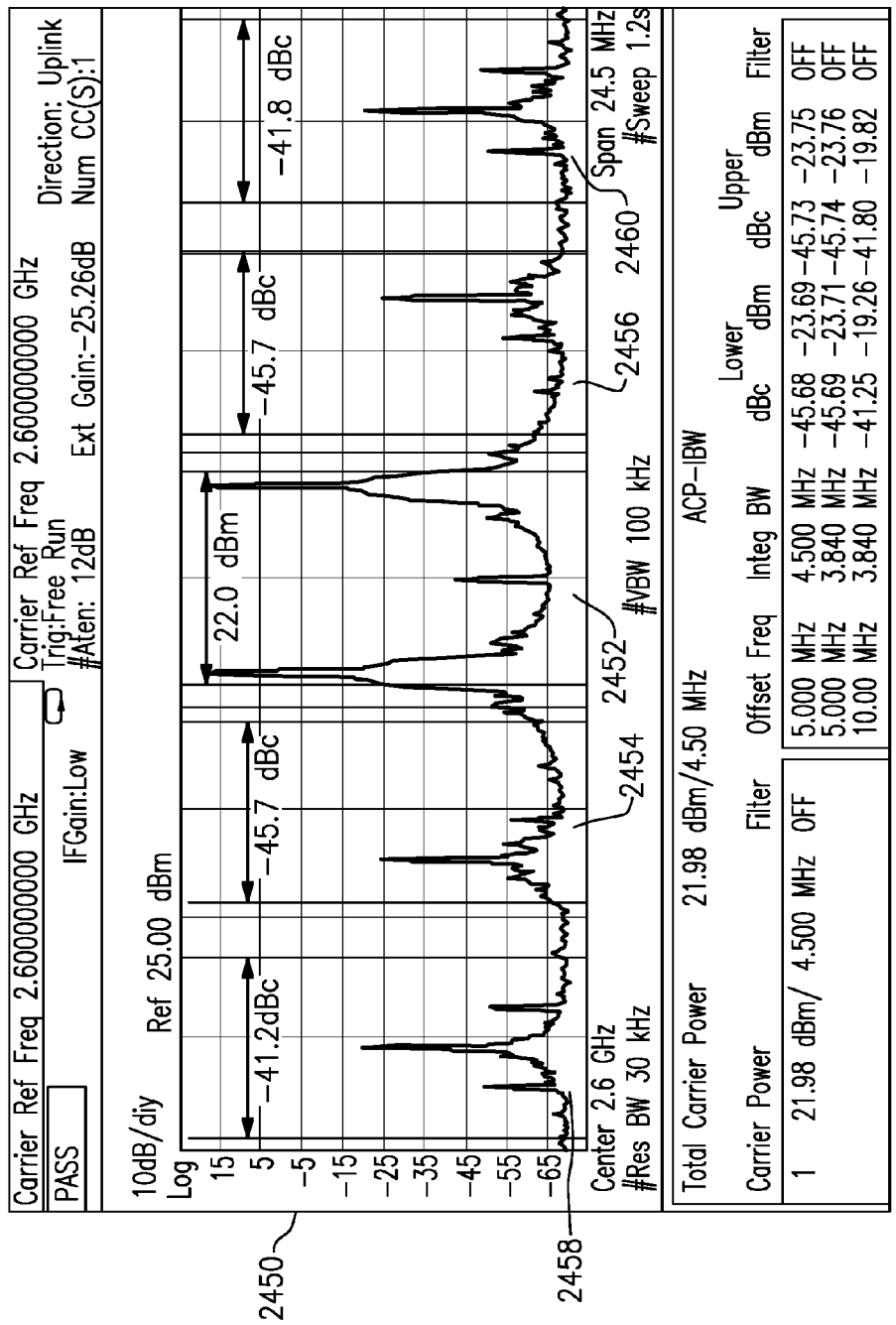
FIG. 24B is a plot of output signal power verses frequency for RF power amplifier of FIG. 24A with linearization, according to certain embodiments.

FIG. 24B is a plot 2450 of output signal power (y-axis) verses frequency (x-axis) for the test CMOS power amplifier with linearization as described herein. The following shaping table was used:

SHAPING TABLE

| $P_{IN}$ (W) | $V_{ET}$ (V) |
| --- | --- |
| 0 | 2 |
| 0.02 | 2.20 |
| 0.04 | 2.04 |
| 0.06 | 2.06 |
| 0.08 | 2.08 |
| 0.1 | 2.1 |
| 0.12 | 2.12 |
| 0.14 | 2.14 |
| 0.16 | 2.16 |
| 0.18 | 2.18 |
| 0.2 | 2.2 |

Referring to plots 2400, 2450, center bands 2402, 2452 show the 2.6 GHz carrier and the 2 tones 2 MHz apart from the carrier (the fundamental frequencies). Bands 2404 and 2406 of plot 2400 and bands 2454 and 2456 of plot 2450 show the third order intermodulation products of the 2 tones. Bands 2408 and 2410 of plot 2400 and bands 2458 and 2460 of plot 2450 show the fifth order intermodulation products of the 2 tones.

The third order intermodulation distortion in plot 2400 (no linearization) is approximately −23 dBc, while the third order intermodulation distortion in plot 2450 (with linearization) is approximately −45 dBc. The improvement in the third order intermodulation distortion as a result of applying linearization, such as linearization circuit 2000, is approximately −22 dBm at constant output power.

Further, the fifth order intermodulation products (bands 2408, 2410) in the amplifier circuit without amplifier linearization are greater than the fifth order intermodulation products (bands 2458, 2460) in the amplifier circuit with the amplifier linearization.

Figure 25:
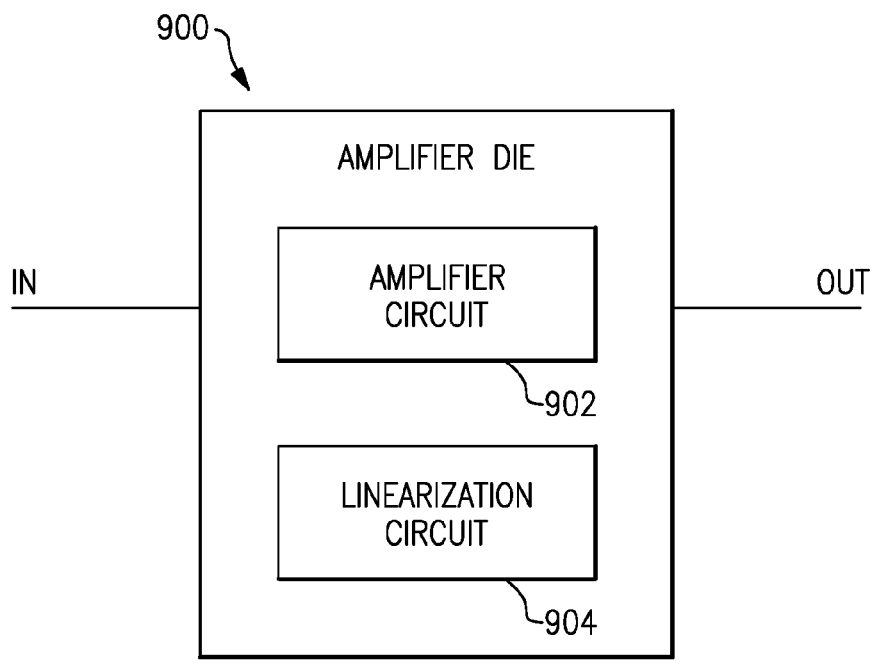
FIG. 25 is an exemplary block diagram of an amplifier die including an embodiment of a linearization circuit, according to certain embodiments.

FIG. 25 is an exemplary block diagram of an amplifier die 900 including an embodiment of an amplifier circuit 902 and an embodiment of an amplifier linearization circuit 904. In an embodiment, the amplifier circuit 902 comprises a low noise amplifier. In another embodiment, the amplifier circuit 902 comprises a power amplifier. In an embodiment, the amplifier linearization circuit 904 comprises the linearization circuit 2000.

In an embodiment, the die 900 comprises a silicon (Si) die. In an embodiment, the Si die comprises a Si CMOS die, a SiGe BiCMOS die, or the like. In another embodiment, the die 900 comprises a gallium arsenide (GaAs) die, a heterojunction bipolar transistor (HBT) die, a pseudomorphic high electron mobility transistor (pHEMT) die, or the like.

Figure 26:
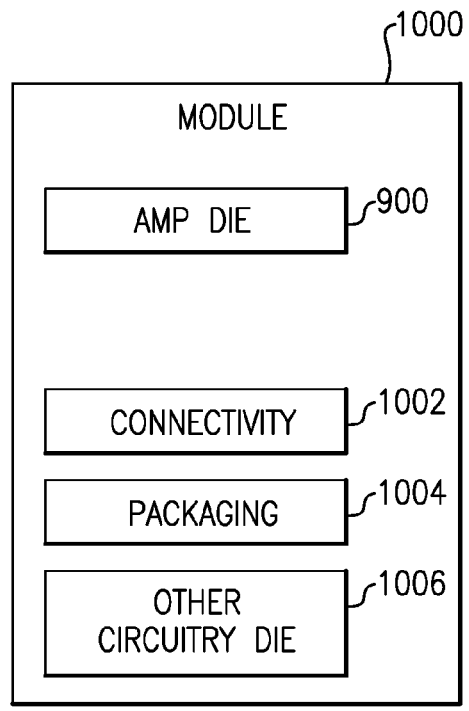
FIG. 26 is an exemplary block diagram of a multimode signal processing module including the amplifier die of FIG. 25, according to certain embodiments.

FIG. 26 is an exemplary block diagram of a module 1000 including amplifier die 900 of FIG. 25. The module 1000 further includes connectivity 1002 to provide signal interconnections, packaging 1004, such as for example, a package substrate, for packaging of the circuitry, and other circuitry die 1006, such as, for example amplifiers, pre-filters, post filters modulators, demodulators, down converters, and the like, as would be known to one of skill in the art of semiconductor fabrication in view of the disclosure herein. In an embodiment, the module 1000 comprises a front-end module.

Figure 27:
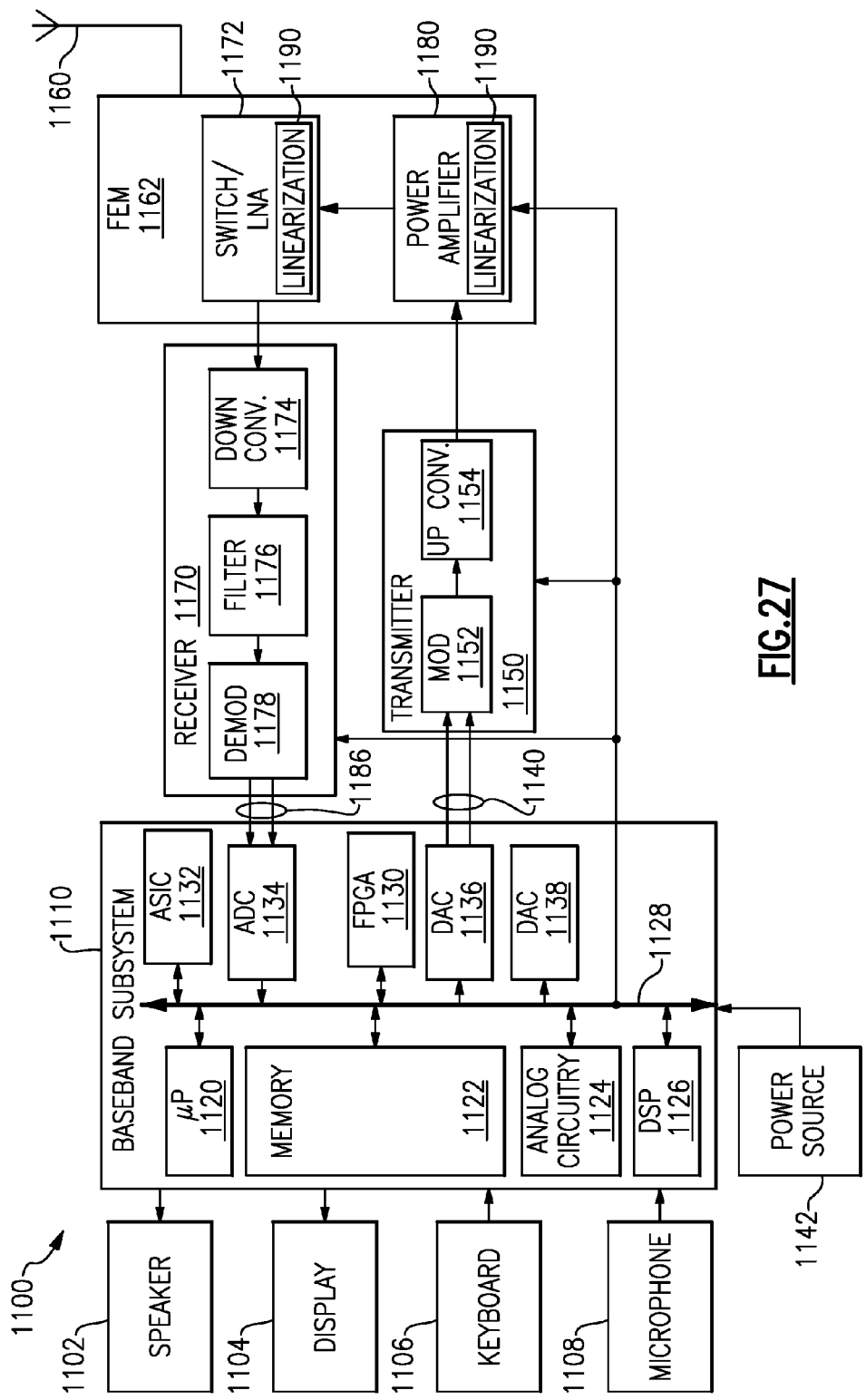
FIG. 27 is an exemplary block diagram illustrating a simplified portable transceiver including embodiments of amplifiers with linearization functionality, according to certain embodiments.

FIG. 27 is an exemplary block diagram illustrating a simplified portable transceiver 1100 including an embodiment of the amplifier linearization circuit 2000.

The portable transceiver 1100 includes a speaker 1102, a display 1104, a keyboard 1106, and a microphone 1108, all connected to a baseband subsystem 1110. A power source 1142, which may be a direct current (DC) battery or other power source, is also connected to the baseband subsystem 1110 to provide power to the portable transceiver 1100. In a particular embodiment, portable transceiver 1100 can be, for example but not limited to, a portable telecommunication device such as a mobile cellular-type telephone. The speaker 1102 and the display 1104 receive signals from baseband subsystem 1110, as known to those skilled in the art. Similarly, the keyboard 1106 and the microphone 1108 supply signals to the baseband subsystem 1110.

The baseband subsystem 1110 includes a microprocessor (μP) 1120, memory 1122, analog circuitry 1124, and a digital signal processor (DSP) 1126 in communication via bus 1128. Bus 1128, although shown as a single bus, may be implemented using multiple busses connected as necessary among the subsystems within the baseband subsystem 1110. The baseband subsystem 1110 may also include one or more of an application specific integrated circuit (ASIC) 1132 and a field programmable gate array (FPGA) 1130.

The microprocessor 1120 and memory 1122 provide the signal timing, processing, and storage functions for portable transceiver 1100. The analog circuitry 1124 provides the analog processing functions for the signals within baseband subsystem 1110. The baseband subsystem 1110 provides control signals to a transmitter 1150, a receiver 1170, and a power amplifier 1180, for example.

It should be noted that, for simplicity, only the basic components of the portable transceiver 1100 are illustrated herein. The control signals provided by the baseband subsystem 1110 control the various components within the portable transceiver 1100. Further, the function of the transmitter 1150 and the receiver 1170 may be integrated into a transceiver.

The baseband subsystem 1110 also includes an analog-to-digital converter (ADC) 1134 and digital-to-analog converters (DACs) 1136 and 1138. In this example, the DAC 1136 generates in-phase (I) and quadrature-phase (Q) signals 1140 that are applied to a modulator 1152. The ADC 1134, the DAC 1136 and the DAC 1138 also communicate with the microprocessor 1120, the memory 1122, the analog circuitry 1124 and the DSP 1126 via bus 1128. The DAC 1136 converts the digital communication information within baseband subsystem 1110 into an analog signal for transmission to the modulator 1152 via connection 1140. Connection 1140, while shown as two directed arrows, includes the information that is to be transmitted by the transmitter 1150 after conversion from the digital domain to the analog domain.

The transmitter 1150 includes the modulator 1152, which modulates the analog information on connection 1140 and provides a modulated signal to upconverter 1154. The upconverter 1154 transforms the modulated signal to an appropriate transmit frequency and provides the upconverted signal to the power amplifier 1180. The power amplifier 1180 amplifies the signal to an appropriate power level for the system in which the portable transceiver 1100 is designed to operate.

Details of the modulator 1152 and the upconverter 1154 have been omitted, as they will be understood by those skilled in the art. For example, the data on connection 1140 is generally formatted by the baseband subsystem 1110 into in-phase (I) and quadrature (Q) components. The I and Q components may take different forms and be formatted differently depending upon the communication standard being employed.

A front-end module 1162 comprises the power amplifier (PA) circuit 1180 and a switch/low noise amplifier (LNA) circuit 1172. In an embodiment, the switch/low noise amplifier circuit 1172 comprises an antenna system interface that may include, for example, a diplexer having a filter pair that allows simultaneous passage of both transmit signals and receive signals, as known to those having ordinary skill in the art.

In an embodiment, the front-end module 1162 further comprises one or more linearization circuits 1190. In an embodiment, the power amplifier circuit 1180 comprises a first linearization circuit 1190, which cancels at least a portion of intermodulation signals, which in turn, reduces intermodulation distortion to improve linearity of the power amplifier in the power amplifier circuit 1180. In another embodiment, the low noise amplifier circuit 1172 further comprises a second linearization circuit 1190, which cancels at least a portion of the intermodulation signals, which in turn, reduces intermodulation distortion to improve linearity of the low noise amplifier in the switch/low noise amplifier circuit 1172. In an embodiment, the linearization circuit 1190 comprises the module 1000. In another embodiment, the linearization circuit 1190 comprises the die 900.

The power amplifier 1180 supplies the amplified transmit signal to the switch/low noise amplifier circuit 1172. The transmit signal is supplied from the front-end module 1162 to the antenna 1160 when the switch is in the transmit mode.

A signal received by antenna 1160 will be directed from the switch/low noise amplifier 1172 of the front-end module 1162 to the receiver 1170 when the switch is in the receive mode. The low noise amplifier circuitry 1172 amplifies the received signal.

If implemented using a direct conversion receiver (DCR), the downconverter 1174 converts the amplified received signal from an RF level to a baseband level (DC), or a near-baseband level (approximately 100 kHz). Alternatively, the amplified received RF signal may be downconverted to an intermediate frequency (IF) signal, depending on the application. The downconverted signal is sent to the filter 1176. The filter 1176 comprises a least one filter stage to filter the received downconverted signal as known in the art.

The filtered signal is sent from the filter 1176 to the demodulator 1178. The demodulator 1178 recovers the transmitted analog information and supplies a signal representing this information via connection 1186 to the ADC 1134. The ADC 1134 converts these analog signals to a digital signal at baseband frequency and transfers the signal via bus 1128 to the DSP 1126 for further processing.

The methods and apparatus described herein provides IMD Cancellation using a Straightforward Mechanism having a Significant Effect with simple circuitry. Linearization described herein can be achieved In wide range of signal bandwidth, carrier frequency, RF power level, N-tone signals, and with different technology where $g_d>0$, $g_m>0$, and $g_{m3}<0$, such as, but not limited to MOS, HBT, pHEMT, GaN, and the like.

Terminology

Some of the embodiments described above have provided examples in connection with mobile phones. However, the principles and advantages of the embodiments can be used for any other systems or apparatus that have needs for power amplifier systems.

Such a system or apparatus can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone such as a smart phone, a telephone, a television, a computer monitor, a computer, a hand-held computer, a laptop computer, a tablet computer, a personal digital assistant (PDA), a PC card, a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method to improve amplifier linearity, the method comprising:
   receiving at a first terminal of an amplifier a first signal including first signal components having a first frequency and second signal components having a second frequency;
   generating a second signal having a third frequency approximately equal to the difference of the first frequency and the second frequency;
   detecting a power level of the first signal;
   adjusting an amplitude of the second signal based at least in part on the detected power level of the first signal and a tuned slope of a shaping function; and
   applying the second signal to a second terminal of the amplifier to generate an intermodulation between the first and the second signals to cancel at least a portion of intermodulation components in a third signal being output from the amplifier, said adjusting occurring without feedback of the third signal.

2. The method of claim 1 wherein the intermodulation components include third order intermodulation products of the first and second frequencies.

3. The method of claim 1 wherein the amplifier includes one or more field effect transistors.

4. The method of claim 3 wherein the first terminal includes a gate terminal.

5. The method of claim 3 wherein the second terminal includes a drain terminal.

6. The method of claim 1 wherein the amplifier includes one or more bipolar junction transistors.

7. The method of claim 6 wherein the first terminal includes a base terminal.

8. The method of claim 6 wherein the second terminal includes a collector terminal.

9. An amplifier linearization circuit assembly for reducing intermodulation distortion in an amplifier, the amplifier linearization circuit assembly comprising:
   a difference frequency circuit configured to receive a first signal including a first frequency and a second frequency and to generate a second signal having a frequency approximately equal to the difference of the first frequency and the second frequency, when received at an input terminal of an amplifier, the first signal generating first intermodulation products between the first and second frequencies in an output signal of the amplifier;

a power detector configured to detect a power level of the first signal; and an envelope adjustor configured to adjust a magnitude of the second signal without feedback of the output signal and based at least in part on the detected power level of the first signal and a tuned slope of a shaping function, the adjusted signal configured to be applied to a second terminal of the amplifier to generate second intermodulation products with the first signal that cancel at least a portion of the first intermodulation products.

10. The amplifier linearization circuit assembly of claim 9 wherein the amplifier includes a power amplifier.

11. The amplifier linearization circuit assembly of claim 9 wherein the second terminal of the amplifier is a drain terminal of the amplifier.

12. The amplifier linearization circuit assembly of claim 9 wherein the first intermodulation products include third order intermodulation products between the first frequency and the second frequency.

13. The amplifier linearization circuit assembly of claim 9 wherein the second intermodulation products include second order intermodulation products between the first signal and the adjusted signal.

14. A wireless communication device comprising the amplifier linearization circuit assembly of claim 9.

15. A wireless communication device comprising:

an antenna configured to receive and transmit radio frequency signals;

a transceiver configured to provide the antenna with radio frequency signals for transmission and to receive from the antenna radio frequency signals for processing, the transceiver including an amplifier configured to amplify a radio frequency input signal, the amplifier including an input configured to receive the radio frequency input signal and an output configured to provide an amplified radio frequency signal; and an apparatus configured to reduce intermodulation distortion in the amplifier, the apparatus including a difference frequency circuit configured to receive the radio frequency input signal that includes a first frequency and a second frequency and to generate a second signal having a frequency approximately equal to the difference of the first frequency and the second frequency, a power detector configured to detect a power level of the radio frequency input signal, and an envelope adjustor configured adjust an amplitude of the second signal without feedback of the amplified radio frequency signal and based at least in part on the detected power level of the radio frequency input signal and a tuned slope of a shaping function, the amplifier further including a drain terminal configured to receive the envelope-adjusted signal to cancel at least a portion of intermodulation products from the amplified radio frequency signal.

16. The wireless communication device of claim 15 wherein the amplifier includes a power amplifier.

17. The wireless communication device of claim 15 wherein the amplifier includes a low noise amplifier.

18. The wireless communication device of claim 15 wherein the intermodulation products include third order intermodulation products of the first and second frequencies.

19. The wireless communication device of claim 18 wherein the envelope-adjusted signal is further configured to generate second order intermodulation products with the radio frequency input signal that cancel at least a portion of the third order intermodulation products.

20. The wireless communication device of claim 15 wherein the intermodulation products include fifth order intermodulation products of the first and second frequencies.

* * * * *